(12) United States Patent
Mase et al.

(10) Patent No.: US 9,134,401 B2
(45) Date of Patent: Sep. 15, 2015

(54) RANGE SENSOR AND RANGE IMAGE SENSOR

(75) Inventors: Mitsuhito Mase, Hamamatsu (JP); Takashi Suzuki, Hamamatsu (JP); Jun Hiramitsu, Hamamatsu (JP)

(73) Assignee: HAMAMATSU PHOTONICS K. K., Hamamatsu-shi, Shizuoka (JP)

( * ) Notice: Subject to any disclaimer, the term of this patent is extended or adjusted under 35 U.S.C. 154(b) by 260 days.

(21) Appl. No.: 13/431,136

(22) Filed: Mar. 27, 2012

(65) Prior Publication Data

US 2013/0258311 A1  Oct. 3, 2013

(30) Foreign Application Priority Data

Mar. 27, 2012  (JP) ................ P2012-070790

(51) Int. Cl.
*G01C 3/08* (2006.01)
*G01S 7/486* (2006.01)
*G01S 17/89* (2006.01)
(Continued)

(52) U.S. Cl.
CPC ............. *G01S 7/4863* (2013.01); *G01S 17/10* (2013.01); *G01S 17/89* (2013.01); *H01L 27/14603* (2013.01); *H01L 27/14609* (2013.01)

(58) Field of Classification Search
CPC ........ G01C 3/08; G01C 15/002; G01S 17/89; G01S 7/4817; G01S 17/42; G01S 17/10; G01S 7/4863; H04N 5/369; H01L 27/14643
USPC ......... 356/3.01, 4.01, 4.07, 5.01, 5.09, 9, 625
See application file for complete search history.

(56) References Cited

U.S. PATENT DOCUMENTS 7,759,624 B2 *  7/2010  Tachino et al. ............ 250/208.1
2010/0039546 A1   2/2010  Cohen et al.
(Continued)

FOREIGN PATENT DOCUMENTS

| JP | 2009-276243 | 11/2009 |
| JP | 2011-112614 | 6/2011 |
| JP | 2011-133464 | 7/2011 |
| JP | 2011-179926 | 9/2011 |
| WO | WO 2009139312 A1 * | 11/2009 |

OTHER PUBLICATIONS

Zeghbroeck, B. Van. "Principles of Semiconductor Devices." 2011. http://ecee.colorado.edu/~bart/book/book/chapter2/ch2_7.htm.*

(Continued)

*Primary Examiner* — Isam Alsomiri
*Assistant Examiner* — Samantha K Abraham
(74) *Attorney, Agent, or Firm* — Drinker Biddle & Reath LLP

(57) ABSTRACT

A charge generating region is arranged within a region of a polygonal pixel region excluding a corner portion thereof. A signal charge collecting region is arranged at a center portion of the pixel region on the inside of the charge generating region so as to be surrounded by the charge generating region. A photogate electrode is arranged on the charge generating region. A transfer electrode is arranged between the signal charge collecting region and the charge generating region. A semiconductor region has a portion located at the corner portion of the pixel region and the remaining portion located on the outside of the pixel region, and has a conductivity type opposite to that of the signal charge collecting region and an impurity concentration higher than that of surroundings thereof. A readout circuit is arranged in the semiconductor region.

11 Claims, 16 Drawing Sheets

(51) Int. Cl.
*G01S 17/10* (2006.01)
*H01L 27/146* (2006.01)

(56) References Cited

U.S. PATENT DOCUMENTS

| | | | |
|---|---|---|---|
| 2011/0037969 A1* | 2/2011 | Spickermann et al. | 356/5.01 |
| 2011/0141452 A1* | 6/2011 | Mase et al. | 356/4.01 |
| 2012/0038904 A1* | 2/2012 | Fossum et al. | 356/5.09 |
| 2012/0199882 A1* | 8/2012 | Shin | 257/222 |

OTHER PUBLICATIONS

T.Y. Lee et al., "A 192×108 pixel ToF-3D image sensor with single-tap concentric-gate demodulation pixels in 0.13 μm technology", Proceeding of the 2011 IEEE International Electron Devices Meeting, Dec. 5-8, 2011, p. 8.7.1-p. 8.7.4.

English-language translation of International Preliminary Report on Patentability (IPRP) dated Oct. 9, 2014 that issued in WO Patent Application No. PCT/JP2012/079414.

* cited by examiner

RANGE SENSOR AND RANGE IMAGE SENSOR

BACKGROUND OF THE INVENTION

1. Field of the Invention

The present invention relates to a range sensor and a range image sensor.

2. Related Background Art

TOF (Time-Of-Flight) range image sensors (range sensors) have been known (see, for example, T. Y. Lee et al., "A 192×108 pixel ToF-3D image sensor with single-tap concentric-gate demodulation pixels in 0.13 μm technology," Proceedings of the 2011 IEEE International Electron Devices Meeting, December 5-8, pp. 8.7.1-8.7.4). The range image sensor disclosed in this literature comprises a charge generating region which generates a charge in response to light incident thereon, a charge collecting region arranged on the inside of the charge generating region so as to be surrounded by the charge generating region, a charge discharging region arranged on the outside of the charge generating region so as to surround the charge generating region, an inner gate electrode which is arranged on the charge generating region and allows the charge of the charge generating region to flow into the charge collecting region in response to an input signal, and an outer discharge gate electrode which is arranged on the charge generating region and allows the charge of the charge generating region to flow into the charge discharging region in response to an input signal. The charge collecting region is arranged at a center portion of a polygonal pixel region, while the charge discharging region is arranged all around the periphery of the pixel region. An electric potential difference provided between the inner gate electrode and the outer discharge gate electrode forms a potential gradient in a region immediately below the inner gate electrode and the outer discharge gate electrode. The charge generated in the charge generating region migrates to the charge collecting region or charge discharging region according to the potential gradient.

SUMMARY OF THE INVENTION

Such a range image sensor (range sensor) requires a readout circuit for reading out a signal corresponding to the charge quantity accumulated in the signal charge collecting region. However, the range image sensor disclosed in the above-mentioned literature suggests no specific arrangement of the readout circuit.

When the readout circuit is arranged within the pixel region, the area of the charge generating region is reduced by the area of the readout circuit, whereby the aperture ratio decreases.

When the readout circuit is arranged on the outside of the pixel region, the aperture ratio is restrained from decreasing. However, a region for arranging the readout circuit must be set independently of the pixel region, whereby the sensor area utilization efficiency decreases. It may also become necessary to prepare a chip for the pixel region and a chip for the readout circuit separately from each other and bond them together by bumps and the like. This may be problematic in that it makes the system bulky, increases manufacturing steps, incurs a higher cost, and so forth.

It is an object of the present invention to provide a range sensor and range image sensor which can arrange a readout circuit appropriately, while restraining the aperture ratio and sensor area utilization efficiency from decreasing.

In one aspect, the present invention provides a range sensor comprising a charge generating region, arranged within a region of a polygonal pixel region excluding a corner portion thereof, for generating a charge in response to light incident thereon; a signal charge collecting region, arranged at a center portion of the pixel region on the inside of the charge generating region so as to be surrounded by the charge generating region, for collecting a signal charge from the charge generating region; a photogate electrode arranged on the charge generating region; a transfer electrode, arranged between the signal charge collecting region and the charge generating region, for allowing the signal charge from the charge generating region to flow into the signal charge collecting region in response to an input signal; a semiconductor region having a part located at the corner portion of the pixel region and the remaining portion located on the outside of the pixel region, and having a conductivity type opposite to that of the signal charge collecting region and an impurity concentration higher than that of surroundings thereof; and a readout circuit, arranged in the semiconductor region, for reading out a signal corresponding to a charge quantity accumulated in the signal charge collecting region.

In the present invention, the semiconductor region in which the readout circuit is arranged has the portion located at the corner portion of the pixel region. That is, the pixel region and the semiconductor region (the region in which the readout circuit is arranged) are set so as to partly overlap each other. This can restrain the aperture ratio and the sensor area utilization efficiency from decreasing, while appropriately arranging the readout circuit.

When the charge generating region extends to the corner portion of the pixel region, a charge generated in a region corresponding to the corner portion of the pixel region migrates by a long distance to the signal charge collecting region arranged at the center portion of the pixel region. In this case, it takes a longer time to transfer the charge generated in the region corresponding to the corner portion to the signal charge collecting region, thereby worsening the efficiency in transferring the signal charge to the charge collecting region. In the present invention, by contrast, no charge generating region is arranged at the corner portion of the pixel region as mentioned above, so that no signal charge is transferred from a region where the migration length is longer. This improves the efficiency in transferring the signal charge to the charge collecting region.

The semiconductor region enhances the potential in a region immediately below the semiconductor region. Therefore, when transferring a signal charge to the charge collecting region, the potential gradient becomes greater, thereby raising the migration speed of the signal charge transferred from the charge generating region to the charge collecting region. This improves the efficiency in transferring the signal charge to the charge collecting region.

The semiconductor region may be arranged at all the corner portions of the pixel region. This can further improve the efficiency in transferring the signal charge to the charge collecting region.

A plurality of the adjacent pixel regions may be provided, while the remaining portion of the semiconductor region may be located at a corner portion of the pixel region adjacent thereto. This can restrain the aperture ratio and sensor area utilization efficiency from decreasing even when the plurality of the adjacent pixel regions are provided.

The range sensor may further comprise an unnecessary charge discharging region, arranged on the outside of the charge generating region along a side of the pixel region, for discharging an unnecessary charge from the charge generating region, and an unnecessary charge discharge gate electrode, arranged between the unnecessary charge discharging region and the charge generating region, for allowing the unnecessary charge from the charge generating region to flow into the unnecessary charge discharging region in response to an input signal. In this case, the unnecessary charge discharging region can be arranged while restraining the aperture ratio from decreasing.

A charge transfer signal intermittently given a phase shift at a predetermined timing may be supplied to the transfer electrode. In this case, a distance is calculated according to an output from one pixel region. Therefore, the distance calculation can fluctuate less than in a configuration in which the distance is calculated according to outputs from a plurality of pixel regions. This can further raise the sensor area utilization efficiency.

A plurality of the adjacent pixel regions may be provided, the respective charge generating regions of the plurality of pixel regions may be formed integrally with each other, and the respective photogate electrodes of the plurality of pixel regions may be formed integrally with each other. This can further raise the sensor area utilization efficiency.

The transfer electrodes of the plurality of pixel regions may be supplied charge transfer signals having phases different from each other, respectively. In this case, the distance is calculated according to outputs from a plurality of the adjacent pixel regions.

The signal charge collecting region may be rectangular-shaped when viewed in a plan view, the transfer electrode may be substantially polygonal loop-shaped.

In another aspect, the present invention provides a range image sensor, having an imaging region comprising a plurality of units arranged one-dimensionally or two-dimensionally on a semiconductor substrate, for obtaining a range image according to charge quantities output from the units, wherein each of the units is the above-mentioned range sensor.

As mentioned above, the present invention can arrange a readout circuit appropriately and restrain the aperture ratio and sensor area utilization efficiency from decreasing.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The preferred embodiments of the present invention will be described below in detail with reference to the accompanying drawings. In the description, the same elements or elements with the same functionality will be denoted by the same reference signs, without redundant description.

Figure 1:
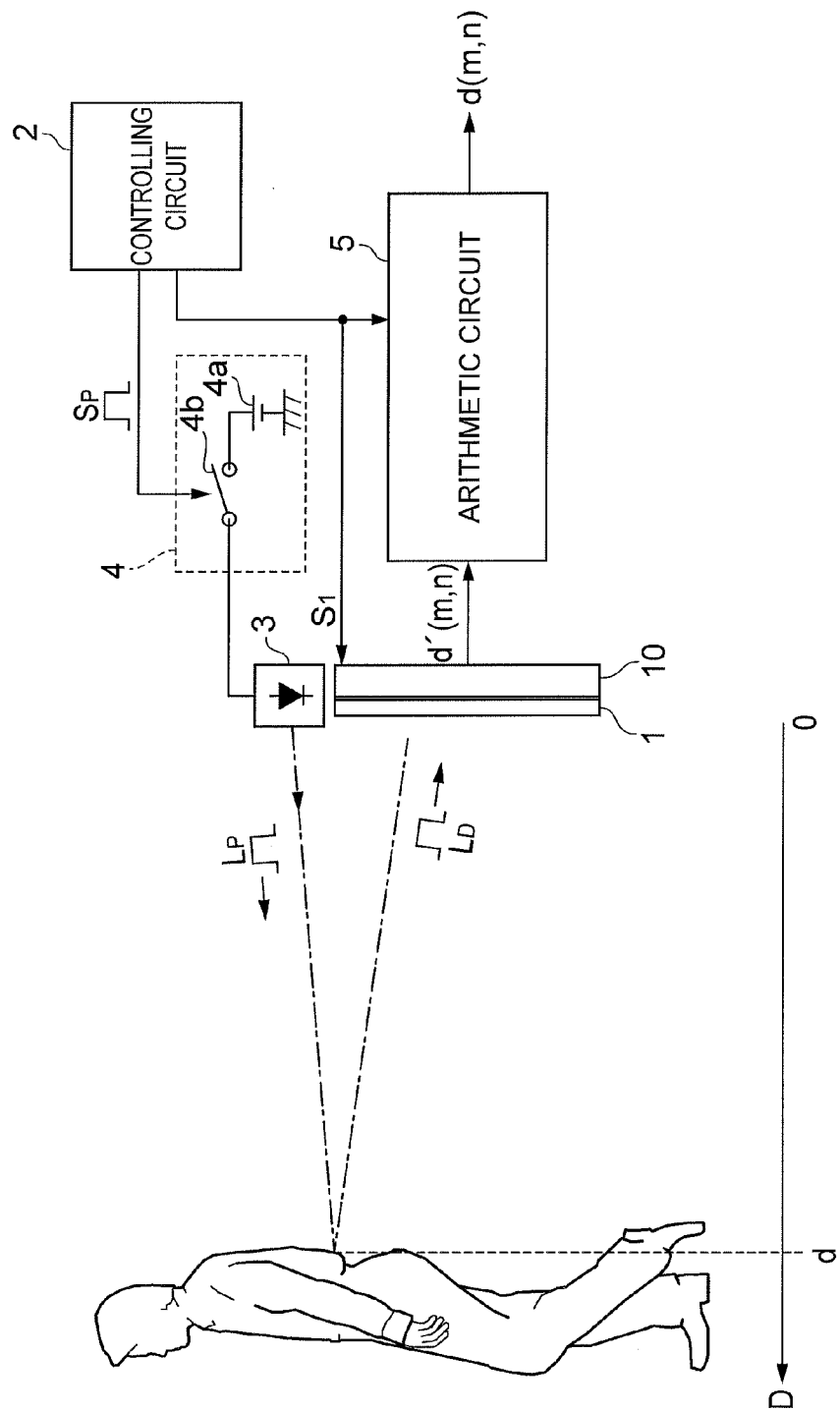
FIG. 1 is an explanatory diagram illustrating a configuration of a distance measuring device in accordance with an embodiment.

FIG. 1 is an explanatory diagram illustrating a configuration of a distance measuring device.

This distance measuring device comprises a range image sensor 1, a light source 3 for emitting a near-infrared light, a driving circuit 4, a controlling circuit 2, and an arithmetic circuit 5. The driving circuit 4 provides the light source 3 with a pulse drive signal Sp. To a first gate electrode (TX1, see FIG. 4) included in each pixel of the range image sensor 1, the controlling circuit 2 feeds a detection gate signal $S_1$ in synchronization with the pulse drive signal $S_P$. From a signal d'(m, n) indicating distance information read from a first semiconductor region (FD1, see FIG. 4) of the range image sensor 1, the arithmetic circuit 5 calculates the distance to an object H such as a pedestrian or the like. Let d be the distance from the range image sensor 1 to the object H in a horizontal direction D. The controlling circuit 2 also outputs a charge transfer signal $S_3$ which will be explained later.

The controlling circuit 2 feeds the pulse drive signal Sp to a switch 4b of the driving circuit 4. The light source 3, constituted by an LED or laser diode, for projecting light is connected to a power supply 4a through the switch 4b. When the pulse drive signal $S_P$ is supplied to the switch 4b, a drive current having the same waveform as that of the pulse drive signal $S_P$ is supplied to the light source 3, whereby the light source 3 emits pulsed light $L_P$ as probe light for distance measurement. When the pulse light $L_P$ is irradiated onto the object H, the pulse light is reflected from the object H. The reflected pulse light is incident as pulse light $L_D$ into the range image sensor 1, and a pulse detection signal $S_D$ is output.

The range image sensor 1 is arranged on a wiring board 10. Through a wiring on the wiring board 10, the signal d'(m, n) having the distance information is output from each pixel of the range image sensor 1.

Figure 2:
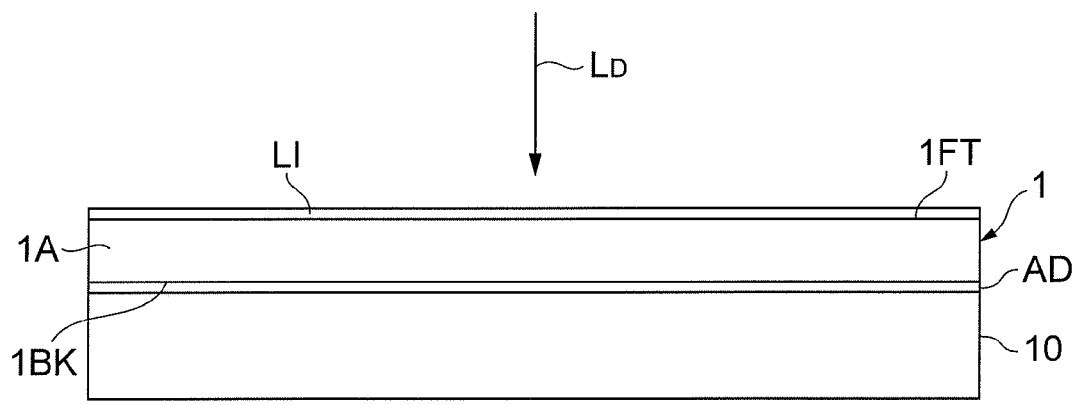
FIG. 2 is a diagram for explaining a cross-sectional configuration of a range image sensor.

FIG. 2 is a diagram for explaining a cross-sectional configuration of the range image sensor.

The range image sensor 1 is a front-illuminated type range image sensor comprising a semiconductor substrate 1A. The pulsed light $L_D$ is incident on the range image sensor 1 from a light incident surface 1FT of the semiconductor substrate 1A. A back surface 1BK of the range image sensor 1 on the side opposite from the light incident surface 1FT is connected to the wiring board 10 through an adhesive region AD. The adhesive region AD includes an insulating adhesive and a filler. The range image sensor 1 includes a light-shielding layer LI having openings formed at predetermined positions. The light-shielding layer LI is disposed in front of the light incident surface 1FT.

Figure 3:
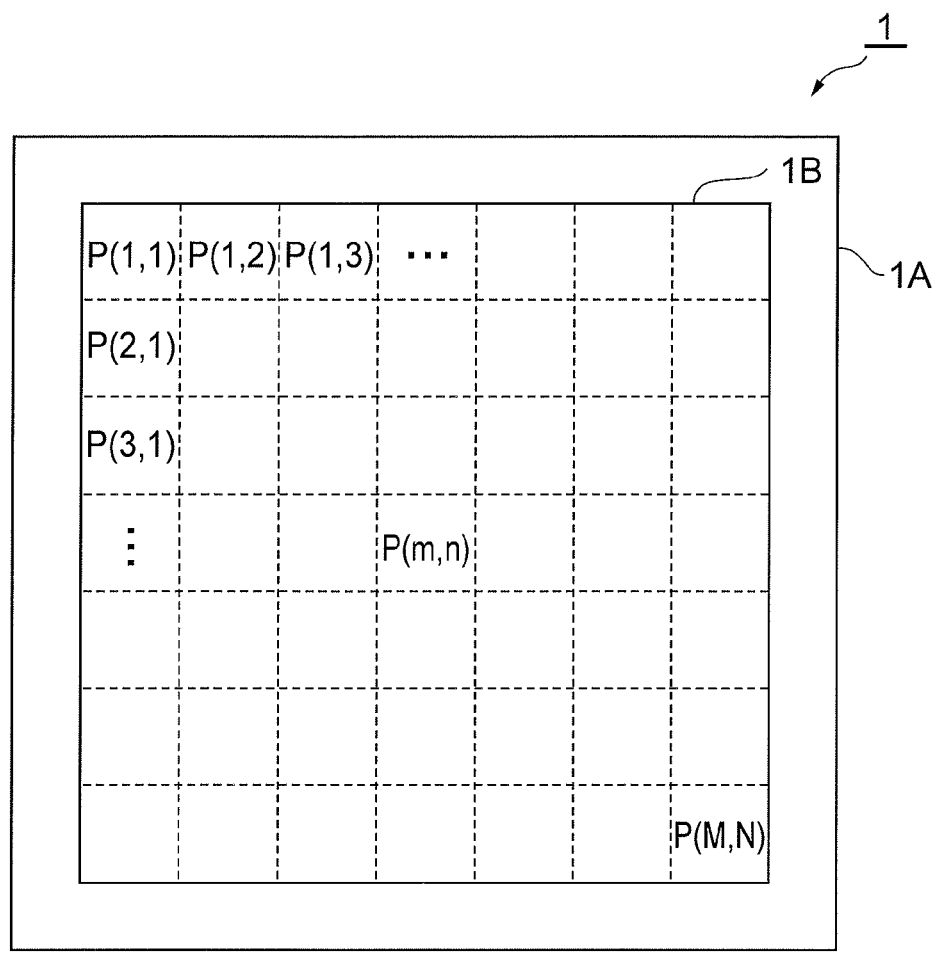
FIG. 3 is a schematic plan view of the range image sensor.

FIG. 3 is a schematic plan view of the range image sensor.

In the range image sensor 1, the semiconductor substrate 1A has an imaging region 1B constituted by a plurality of pixels P(m, n) arranged two-dimensionally. Each pixel P(m, n) outputs two charge quantities Q1, Q2 as the signal d'(m, n) having the above-mentioned distance information. As a microscopic distance measuring sensor, each pixel P(m, n) outputs the signal d'(m, n) corresponding to the distance to the object H. Therefore, when the reflected light from the object H forms an image on the imaging region 1B, a range image of the object as a collection of distance information to respective points on the object H can be acquired. One pixel P(m, n) functions as one range sensor.

Figure 4:
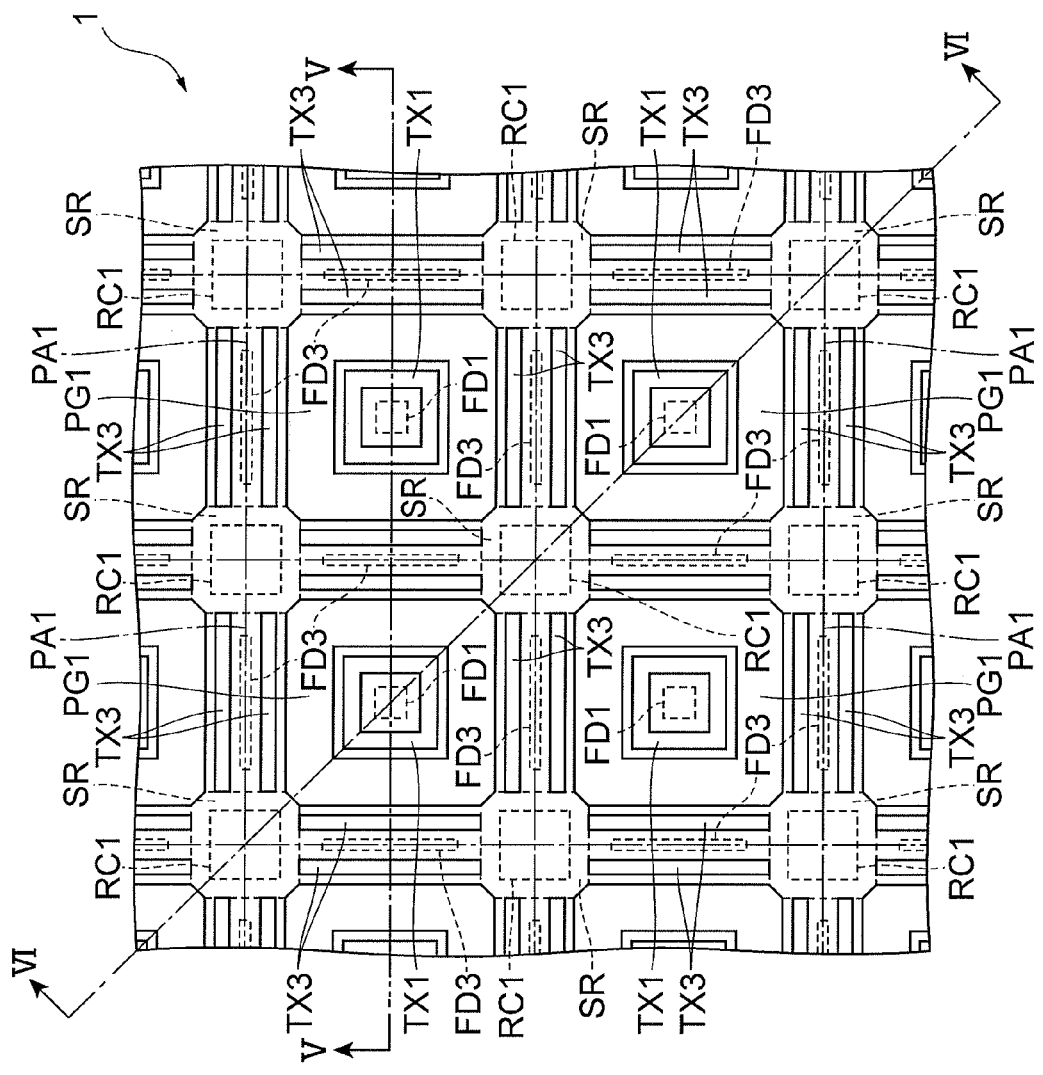
FIG. 4 is a schematic diagram for explaining a configuration of pixel regions of the range image sensor.
Figure 5:
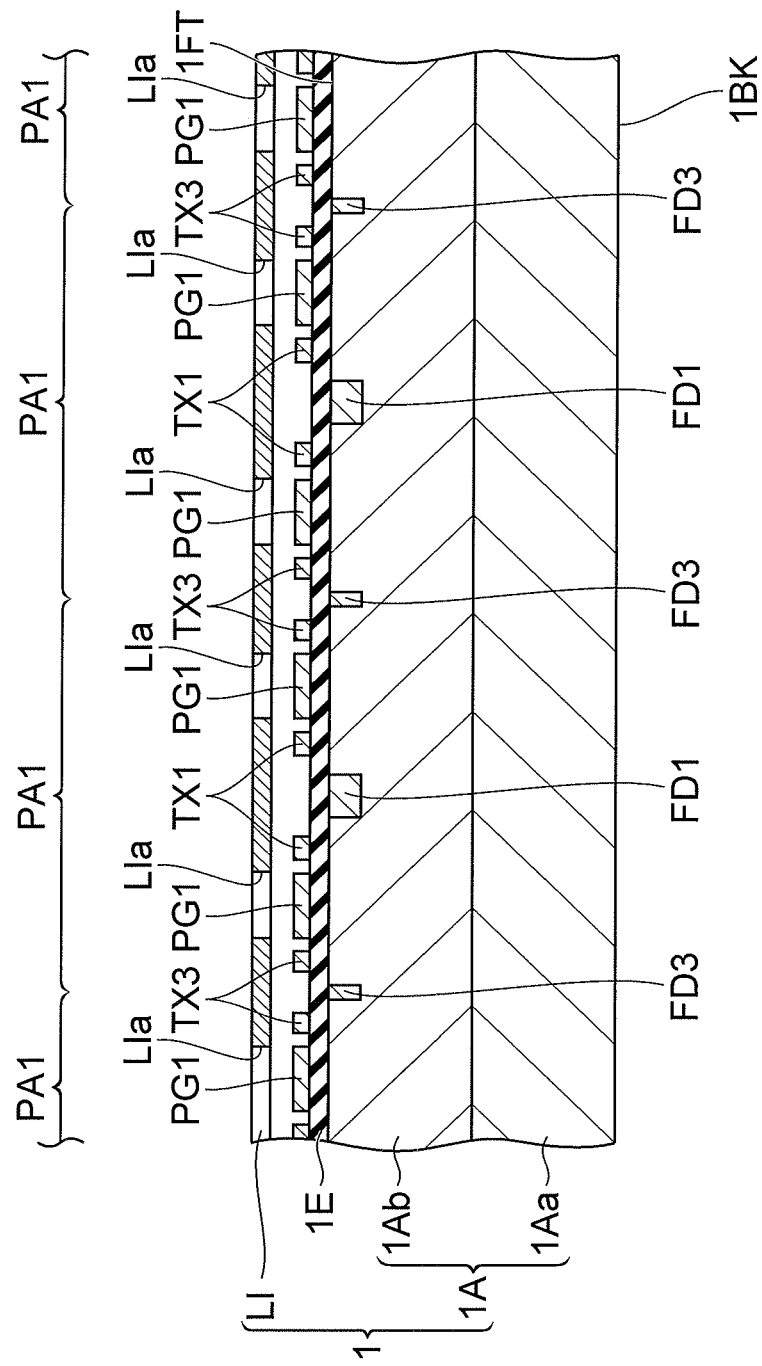
FIG. 5 is a diagram illustrating a cross-sectional configuration taken along the line V-V of FIG. 4.
Figure 6:
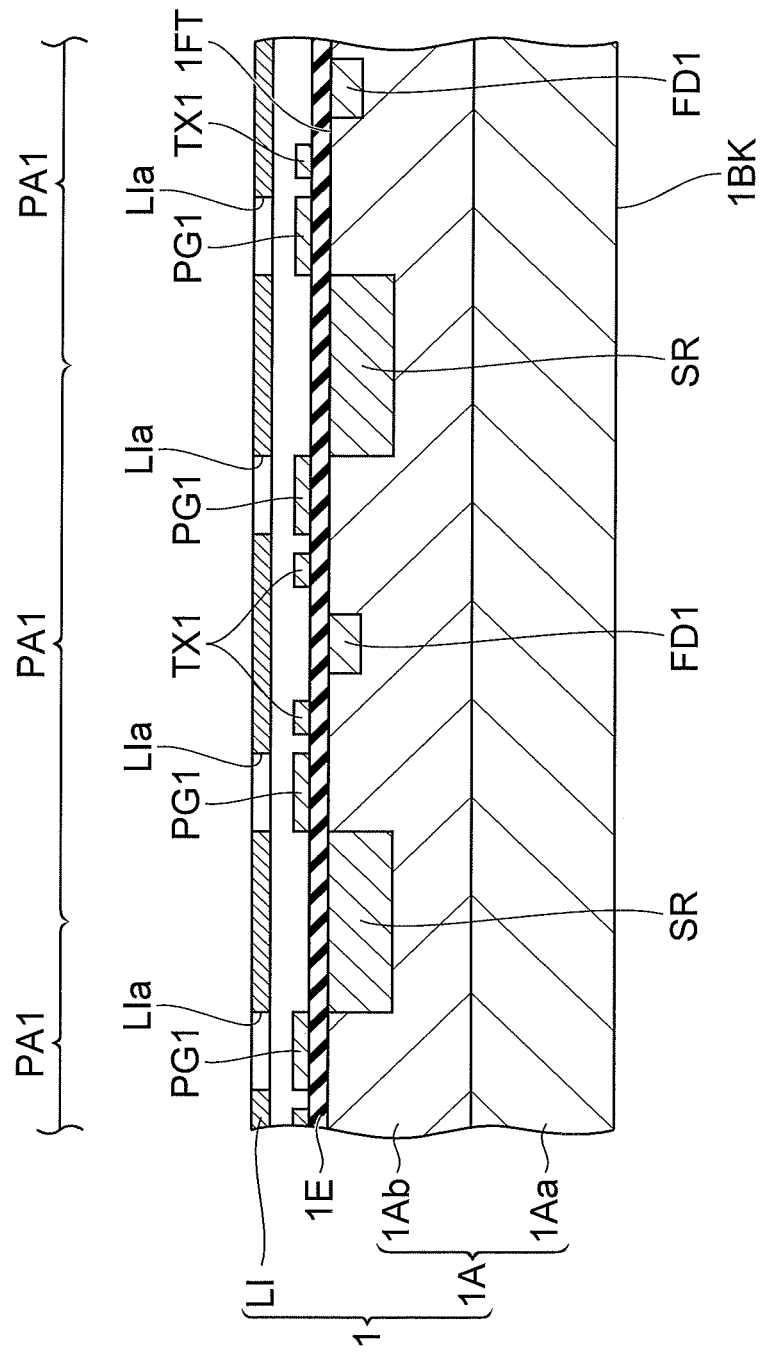
FIG. 6 is a diagram illustrating a cross-sectional configuration taken along the line VI-VI of FIG. 4.

FIG. 4 is a schematic diagram for explaining a configuration of pixels of the range image sensor. FIG. 5 is a diagram illustrating a cross-sectional configuration taken along the line V-V of FIG. 4. FIG. 6 is a diagram illustrating a cross-sectional configuration taken along the line VI-VI of FIG. 4.

As also illustrated in FIG. 2, the range image sensor 1 is provided with the semiconductor substrate 1A having the light incident surface 1FT and back surface 1BK opposing each other. The semiconductor substrate 1A has a p-type first substrate region 1Aa located on the back surface 1BK side and a p$^-$-type second substrate region 1Ab located on the light incident surface 1FT side. The second substrate region 1Ab has an impurity concentration lower than that of the first substrate region 1Aa. The semiconductor substrate 1A can be obtained, for example, by growing on a p-type semiconductor substrate a p$^-$-type epitaxial layer having an impurity concentration lower than that in the semiconductor substrate.

Each pixel P(m, n) of the range image sensor 1 includes one pixel region PA1. That is, a unit arranged in one pixel region PA1 constitutes one pixel P(m, n). In the range image sensor 1, a plurality of pixel regions PA1 are arranged two-dimensionally in row and column directions. Each of the pixel regions PA1 is substantially polygon-shaped when viewed in a plan view. In this embodiment, each pixel region PA1 is rectangle-shaped (in detail, square-shaped). The plurality of pixel regions PA1 are continuous in the row and column directions.

In each pixel region PA1, the range image sensor 1 comprises a photogate electrode PG1, a first gate electrode TX1, a plurality of third gate electrodes TX3, a first semiconductor region FD1, a plurality of third semiconductor regions FD3, and a plurality of fourth semiconductor regions SR.

The photogate electrode PG1 is provided through an insulating layer 1E on the light incident surface 1FT and arranged in a region within the pixel region PA1. The first and third gate electrodes TX1, TX3 are provided through the insulating layer 1E on the light incident surface 1FT and adjacent to the photogate PG1. Each of the first and third semiconductor regions FD1, FD3 accumulate charges flowing into regions immediately below their corresponding gate electrodes TX1, TX3. In the present embodiment, the semiconductor substrate 1A is comprised of Si, and the insulating layer 1E is comprised of SiO$_2$.

In the light-shielding layer LI, a substantially polygonal loop-shaped openings LIa are formed at respective regions corresponding to the pixel regions PA1. Light (reflected light from the object H) is incident on the semiconductor substrate 1A through the openings LIa of the light-shielding layer LI. Therefore, opening LIa defines a rectangular loop-shaped light receiving region in the semiconductor substrate 1A. The light-shielding layer LI is comprised of metal such as aluminum or the like, for example.

In each pixel region PA1, the photogate electrode PG1 is arranged so as to correspond to the opening LIa. The shape of the photogate electrode PG1 corresponds to that of the opening LIa and is substantially polygonal loop-shaped when viewed in a plan view. The photogate electrode PG1 is arranged in a region separated by a predetermined gap inside from each side (outer edge) of the pixel region PA1. That is, the photogate electrode PG1 is arranged within a region of the pixel region PA1 excluding the corner portions thereof. The outer contour of the photogate electrode PG1 is substantially octagon-shaped, and the inner contour thereof is substantially rectangle-shaped (in detail, square-shaped). The photogate electrode PG1 is comprised of polysilicon but may use other materials as well.

The first semiconductor region FD1 is arranged on the inside of the photogate electrode PG1 so as to be surrounded by the photogate electrode PG1. The first semiconductor region FD1 is arranged as spatially separated from a region immediately below the photogate electrode PG 1. That is, the first semiconductor region FD1 is arranged on the inside of the light receiving region so as to be surrounded by the light receiving region, and is arranged as spatially separated from the light receiving region.

The first semiconductor region FD1 is substantially polygon-shaped when viewed in a plan view. In this embodiment, the first semiconductor region FD1 is rectangle-shaped (in detail, square-shaped). The first semiconductor region FD1 functions as a signal charge collecting region. The first semiconductor region FD1 is a region comprised of an n-type semiconductor having a high impurity concentration, and is a floating diffusion region.

The first gate electrode TX 1 is arranged between the photogate electrode PG1 (light receiving region) and the first semiconductor region FD1. The first gate electrode TX1 is located on the outside of the first semiconductor region FD1 so as to surround the first semiconductor region FD1, and is located on the inside of the photogate electrode PG1 so as to be surrounded by the photogate electrode PG1. The first gate electrode TX1 is arranged as spatially separated from the photogate electrode PG1 and the first semiconductor region FD1 so as to be interposed between the photogate electrode PG1 and the first semiconductor region FD1.

The first gate electrode TX1 is substantially polygonal loop-shaped when viewed in a plan view. In this embodiment, the first gate electrode TX1 is rectangular loop-shaped. The first gate electrode TX1 is comprised of polysilicon but may use other materials as well. The first gate electrode TX1 functions as a transfer electrode.

Each third semiconductor region FD3 is arranged on the outside of the photogate electrode PG1 along its corresponding side of the pixel region PA1. The third semiconductor region FD3 is arranged so as to be spatially separated from the region immediately below the photogate electrode PG1. That is, the third semiconductor region FD3 is arranged on the outside of the light receiving region while being spatially separated from the light receiving region.

In each pixel region PA, the third semiconductor region FD3 is substantially rectangle-shaped when viewed in a plan view. In this embodiment, the third semiconductor region FD3 is substantially rectangle-shaped (in detail, an oblong-shaped whose longer side direction lies in a direction in which its corresponding side of the pixel region PA1 extends). The third semiconductor regions FD3 adjacent in the row or column direction are formed integrally with each other. As a consequence, in two pixel regions PA1 adjacent in the row or column direction, two third semiconductor regions FD3 located between the pixel regions PA1 are single rectangle-shaped (in detail, single oblong-shaped). The third semiconductor region FD3 functions as an unnecessary charge discharging region. That is, the third semiconductor region FD3 functions as an unnecessary charge discharge drain and is connected to a fixed electric potential Vdd, for example.

Each third gate electrode TX3 is arranged between the photogate electrode PG1 (light receiving region) and the third semiconductor region FD3. The third gate electrode TX3 is arranged as spatially separated from the photogate electrode PG1 and the third semiconductor region FD3 so as to be interposed between the photogate electrode PG1 and the third semiconductor region FD3. The third gate electrode TX3 is comprised of polysilicon but may use other materials as well. The third gate electrode TX3 functions as an unnecessary charge discharge gate electrode.

In each pixel region PA1, the third gate electrode FD3 is substantially polygon-shaped when viewed in a plan view. In this embodiment, the third gate electrode FD3 is substantially rectangle-shaped (in detail, an oblong-shaped whose longer side direction lies in a direction in which its corresponding side of the pixel region PA1 extends).

The photogate electrode PG1, first gate electrode TX1, and third gate electrode TX3 are concentrically arranged around the first semiconductor region FD1 in the order of the first gate electrode TX1, photogate electrode PG1, and third gate electrode TX3 from the first semiconductor region FD1 side.

Each fourth semiconductor region SR is arranged in the corner portion of the pixel region PA1 and outside the photogate electrode PG 1. In each pixel region PA1, the fourth semiconductor regions SR arranged at two adjacent corner portions are arranged to interpose the third semiconductor region FD3 and third gate electrode TX3 therebetween in the row or column direction.

In each pixel region PA1, each fourth semiconductor region SR is substantially polygon-shaped when viewed in a plan view. In this embodiment, the fourth semiconductor region SR is substantially pentagon-shaped. The fourth semiconductor regions SR adjacent in the row and column directions are formed integrally. That is, the fourth semiconductor region SR having a portion located at a corner portion of one pixel region PA1 has the remaining portion located at the respective corner portions of three pixel regions PA1 adjacent to the one pixel region PA1. As a consequence, in four pixel regions PA1 adjacent in the row and column directions, the four fourth semiconductor regions SR located at the center portion of the pixel regions PA1 is single octagon-shaped.

The four fourth semiconductor regions SR adjacent in the row and column directions are arranged at respective corner portions of a quadrangle (square in this embodiment) having diagonal lines orthogonal to each other and containing the first semiconductor region FD1 located at the intersection of the diagonal lines. The first semiconductor regions FD1 adjacent in the row and column directions are located at respective corner portions of a quadrangle (square in this embodiment) having diagonal lines orthogonal to each other and containing the integrally formed four fourth semiconductor regions SR located at the intersection of the diagonal lines.

The fourth semiconductor region SR is a region having the same conduction type as that of the semiconductor substrate 1A and an impurity concentration higher than that of the second semiconductor region 1Ab, i.e., a region constituted by a p-type semiconductor having a high impurity concentration. The fourth semiconductor region SR may also be a p-type well region or p-type diffusion region.

A readout circuit RC1 is arranged in the fourth semiconductor region SR. The readout circuit RC1 is provided for each pixel region PA1. The readout circuit RC1 reads out a signal corresponding to the charge quantity accumulated in the first semiconductor region FD1 of its corresponding pixel region PA1. The readout circuit RC1 is constituted by a floating diffusion amplifier (FDA) or the like.

The above-mentioned regions have thicknesses and impurity concentrations as follows:

first substrate region 1Aa of the semiconductor substrate 1A: thickness of 5~700 μm/impurity concentration of $1\times10^{18}$~$10^{20}$ cm$^{-3}$ second substrate region 1Ab of the semiconductor substrate 1A: thickness of 3~50 μm/impurity concentration of $1\times10^{13}$~$10^{16}$ cm$^{-3}$ first semiconductor region FD1: thickness of 0.1~0.4 μm/impurity concentration of $1\times10^{18}$~$10^{20}$ cm$^{-3}$ third semiconductor region FD3: thickness of 0.1~0.4 μm/impurity concentration of $1\times10^{18}$~$10^{20}$ cm$^{-3}$ fourth semiconductor region SR: thickness of 1 to 5 μm/impurity concentration of $1\times10^{16}$ to $10^{18}$ cm$^{-3}$ The insulating layer 1E is provided with contact holes (not depicted) for exposing the surfaces of the first and third semiconductor regions FD1, FD3. Conductors (not depicted) for connecting the first and third semiconductor regions FD1, FD3 to the outside are arranged within their corresponding contact holes.

The light-shielding layer LI covers the regions where the first and third gate electrodes TX1, TX3 and first, third, and fourth semiconductor regions FD1, FD3, SR are arranged in the semiconductor substrate 1A, so as to prevent light from being incident upon these regions. This can prevent the light incident on the above-mentioned regions from generating unnecessary charges.

The regions corresponding to the photogate electrodes PG1 in the semiconductor substrate 1A (regions immediately below the photogate electrodes PG1) function as charge generating regions for generating charges in response to light incident thereon. Hence, the charge generating regions correspond to the shapes of the photogate electrodes PG1 and openings LIa. That is, in each pixel region PA1, a charge generating region is arranged in a region separated by a predetermined gap inside from each side (outer edge) of the pixel region PA1 excluding the corner portions of the pixel region PA1. The outer contour of the charge generating region is substantially octagon-shaped, and the inner contour thereof is substantially rectangle-shaped (in detail, square-shaped).

When a high level signal (positive electric potential) is supplied to the first gate electrode TX1, a potential below the first gate electrode TX1 becomes lower than a potential in a region immediately below the photogate electrode PG1 in the semiconductor substrate 1A. As a consequence, negative charges (electrons) are drawn toward the first gate electrode TX1, so as to be accumulated in a potential well formed by the first semiconductor region FD1. The first gate electrode TX 1 allows a signal charge to flow into the first semiconductor region FD1 in response to an input signal. An n-type semiconductor contains a positively ionized donor and has a positive potential, so as to attract electrons. When a low level signal (e.g., ground electric potential) is supplied to the first gate electrode TX1, a potential barrier is generated by the first gate electrode TX 1. Therefore, the charges generated in the semiconductor substrate 1A are not drawn into the first semiconductor region FD1.

When a high level signal (positive electric potential) is supplied to the third gate electrode TX3, a region immediately below the third gate electrode TX3 becomes lower than the potential in a region immediately below the photogate electrode PG1 in the semiconductor substrate 1A. As a consequence, negative charges (electrons) are drawn toward the third gate electrode TX3, so as to be accumulated in a potential well formed by the third semiconductor region FD3. When a low level signal (e.g., ground electric potential) is supplied to the third gate electrode TX3, a potential barrier is generated by the third gate electrode TX3. Therefore, the charges generated in the semiconductor substrate 1A are not drawn into the third semiconductor region FD3. A part of the charges generated in the charge generating region in response to the light incident thereon are discharged as unnecessary charges to the third semiconductor region FD3.

In the range image sensor 1, charges generated in the deep semiconductor portion in response to incidence of light for projection are drawn into a potential well provided on the light incident surface 1FT side, whereby high-speed and accurate distance measurement is possible.

The pulsed light $L_D$ from the object, incident through the light incident surface 1FT of the semiconductor substrate 1A, reaches the light receiving regions (charge generating regions) disposed on a surface side of the semiconductor substrate 1A. The charges generated in the semiconductor substrate 1A as the pulsed light is incident thereon are transferred from each charge generating region (each region immediately below the photogate electrode PG 1) to a region immediately below the first gate electrode TX1 adjacent to the corresponding charge generating region. That is, when the detection gate signal $S_1$ in synchronization with the pulse drive signal Sp for the light source is supplied to the first gate electrode TX1 through the wiring board 10, the charges generated in each charge generating region flow into a region immediately below the first gate electrode TX1, and then flow therefrom to the first semiconductor region FD1.

The ratio of charge quantity Q1, Q2 accumulated in the first semiconductor region FD1 at a predetermined timing to the total charge quantity (Q1+Q2) corresponds to the phase difference between the emitted pulsed light emitted with supply of the pulse drive signal $S_P$ to the light source and the detected pulse light returning after reflection of the emitted pulsed light on the object H.

Although not shown in the diagrams, the range image sensor 1 is provided with a back-gate semiconductor region for fixing the electric potential of the semiconductor substrate 1A to a reference electric potential.

Figure 7:
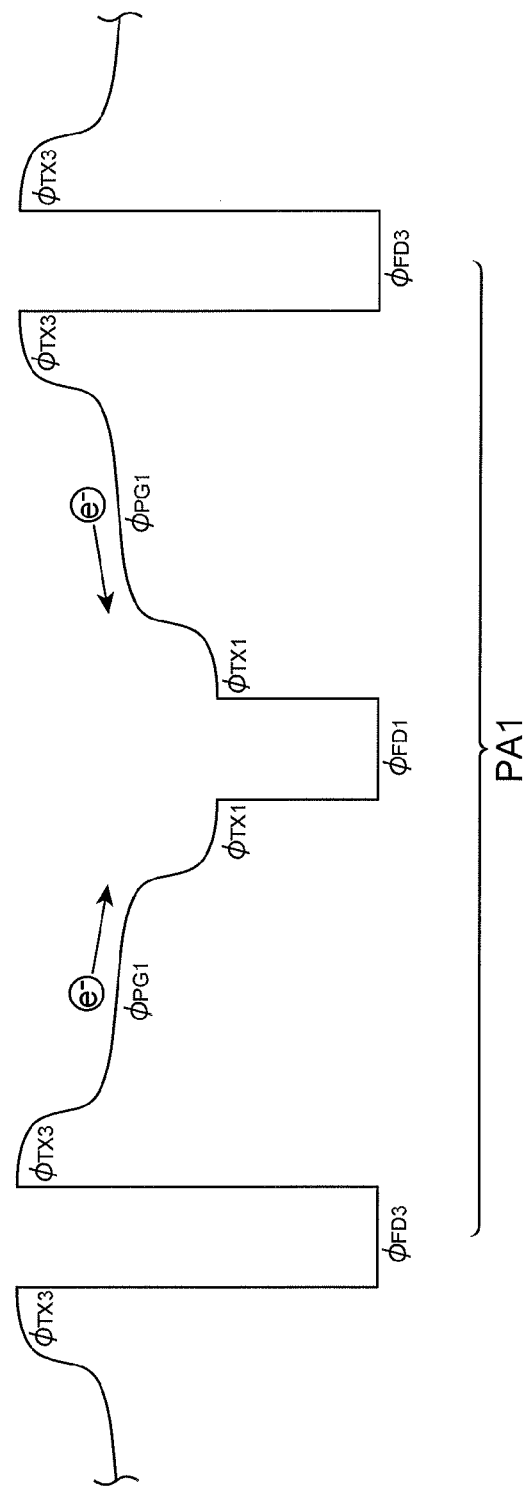
FIG. 7 is a diagram illustrating a potential profile for explaining an accumulation operation of charge.
Figure 8:
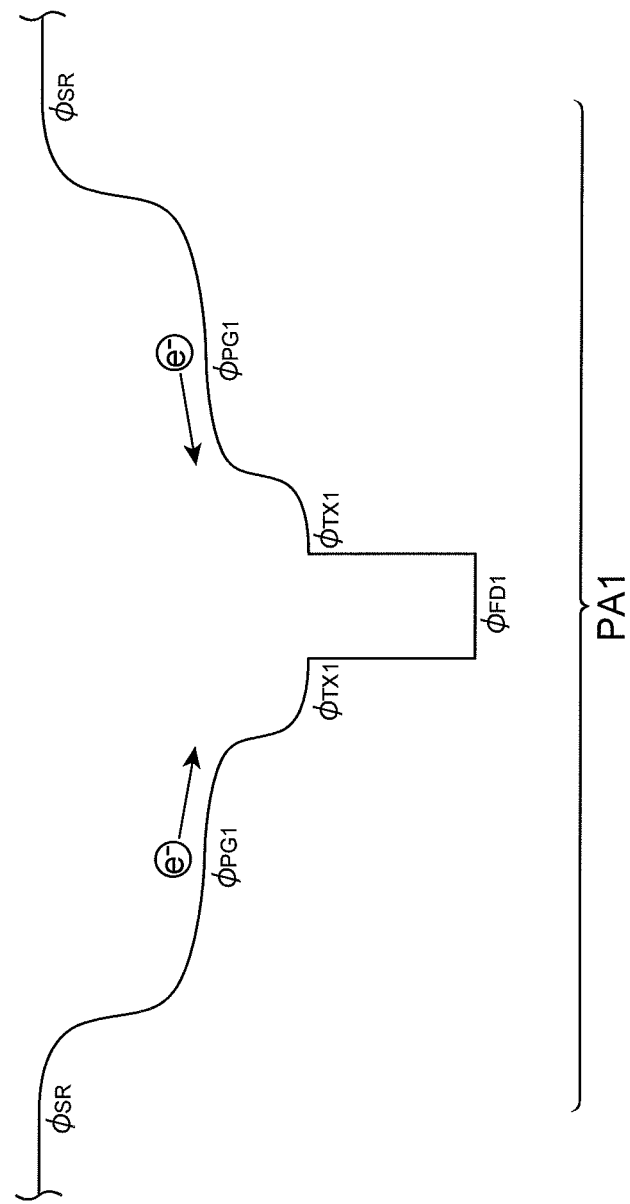
FIG. 8 is a diagram illustrating a potential profile for explaining an accumulation operation of charge.
Figure 9:
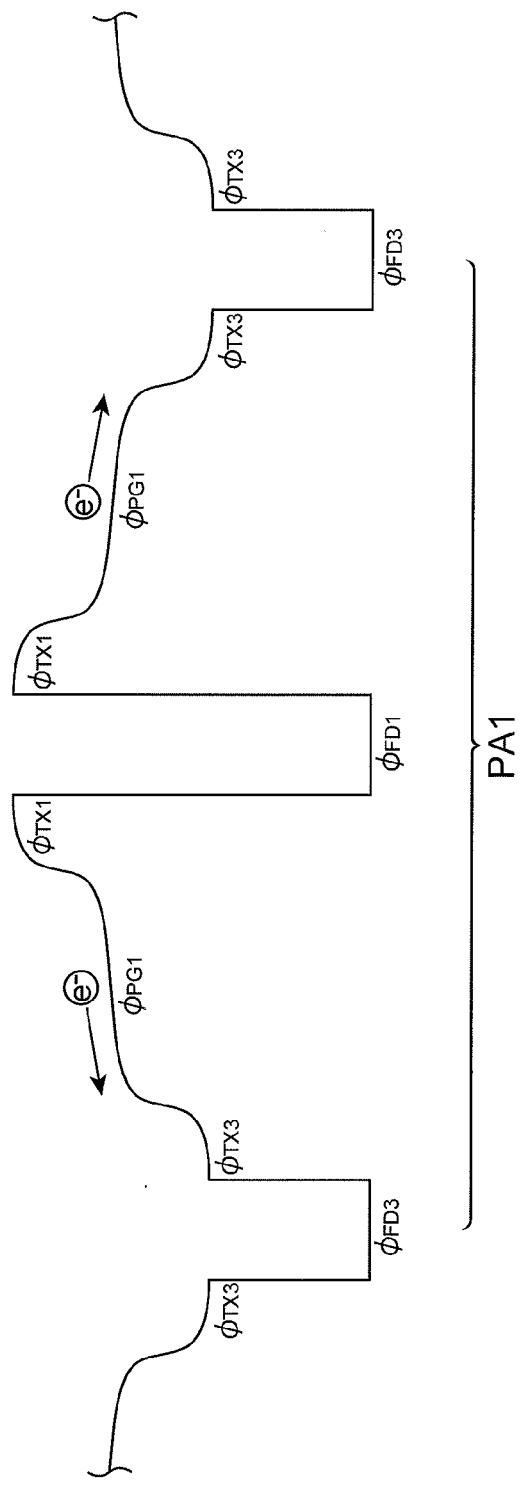
FIG. 9 is a diagram illustrating a potential profile for explaining a discharge operation of charge.
Figure 10:
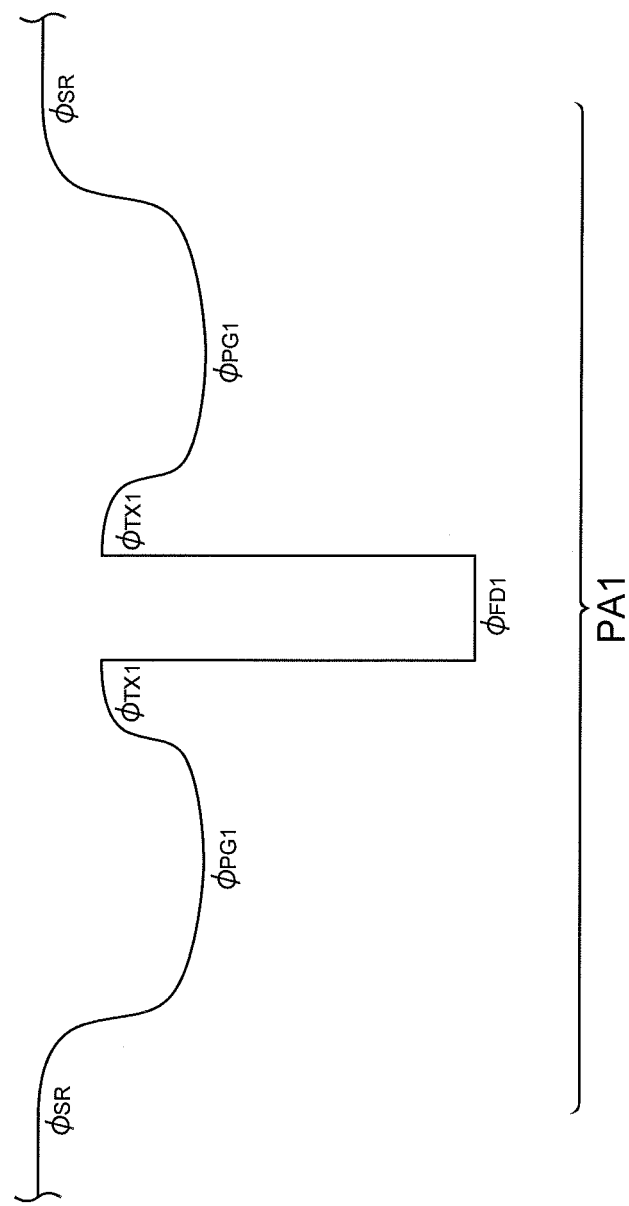
FIG. 10 is a diagram illustrating a potential profile for explaining a discharge operation of charge.

FIGS. 7 and 8 are diagrams illustrating potential profiles near the light incident surface 1FT of the semiconductor substrate 1A for explaining an accumulation operation of charge. FIGS. 9 and 10 are diagrams illustrating potential profiles near the light incident surface 1FT of the semiconductor substrate 1A for explaining a discharge operation of charge. In FIGS. 7 to 10, a downward direction is a positive potential direction. FIGS. 7 and 9 illustrate the potential profiles along the line V-V of FIG. 4. FIGS. 8 and 10 illustrate the potential profiles along the line VI-VI of FIG. 4.

When light is incident, a potential $\phi_{PG1}$ in regions immediately below the photogate electrode PG1 is set slightly higher than the substrate electric potential due to an electric potential (for example, the intermediate electric potential between a higher electric potential and a lower electric potential supplied to the first gate electrode TX1) supplied to the photogate electrode PG1. In each of the diagrams, a potential $\phi_{TX1}$ in the region immediately below the first gate electrode TX1, a potential $\phi_{TX3}$ in the region immediately below the third gate electrode TX3, a potential $\phi_{FD1}$ in the first semiconductor region FD1, a potential $\phi_{FD3}$ in the third semiconductor region FD3, and a potential $\phi_{SR}$ in the fourth semiconductor region SR are shown.

When a high electric potential of the detection gate signal $S_1$ is input to the first gate electrode TX1, charges generated immediately below the photogate electrode PG1 are accumulated in the potential well of the first semiconductor region FD1 through the region immediately below the first gate electrode TX1 according to a potential gradient as illustrated in FIG. 7. In response to the pulse timing of the detection gate signal $S_f$, the charge quantity Q1 or Q2 is accumulated in the potential well of the first semiconductor region FD1.

At this time, as illustrated in FIG. 8, the potential $\phi_{PG1}$ in the region immediately below the photogate electrode PG1 is raised on the corner portion side of the pixel region PA1 because of the fourth semiconductor regions SR arranged there. Hence, a greater gradient of potential lowering from the corner portion side of the pixel region PA1 to the first semiconductor region FD1 is formed in the region immediately below the photogate electrode PG1. Charges generated near the corner portions of the pixel region PA1 in the region immediately below the photogate electrode PG1 are accelerated according to the above-mentioned potential gradient formed by the fourth semiconductor regions SR, so as to migrate rapidly to the first semiconductor region FD1.

During when the detection gate signal $S_1$ is applied to the first gate electrode TX1, a low level electric potential (e.g., ground electric potential) is supplied to the third gate electrode TX3. Therefore, the potential $\phi_{TX3}$ in the region immediately below the third gate electrode TX3 is not lowered, so that no charges flow into the potential well of the third semiconductor region FD3.

When a positive electric potential is supplied to the third gate electrode TX3, as illustrated in FIG. 9, the potential $\phi_{TX3}$ in the region immediately below the third gate electrode TX3 is lowered, whereby the charges generated in the charge generating region (region immediately below the photogate electrode PG1) flow into the potential well of the third semiconductor region FD3. Thus, the charges generated in the charge generating region flow as unnecessary charges into the potential well of the third semiconductor region FD3. The unnecessary charges having flowed into the potential well of the third semiconductor region FD3 are discharged to the outside. During when a positive electric potential is supplied to the third gate electrode TX3, a low level electric potential is supplied to the first gate electrode TX1. Therefore, as also illustrated in FIG. 10, the potential $\phi_{TX1}$ in the region immediately below the first gate electrode TX1 is not lowered, whereby no charges flow into the potential well of the first semiconductor region FD1.

Figure 11:
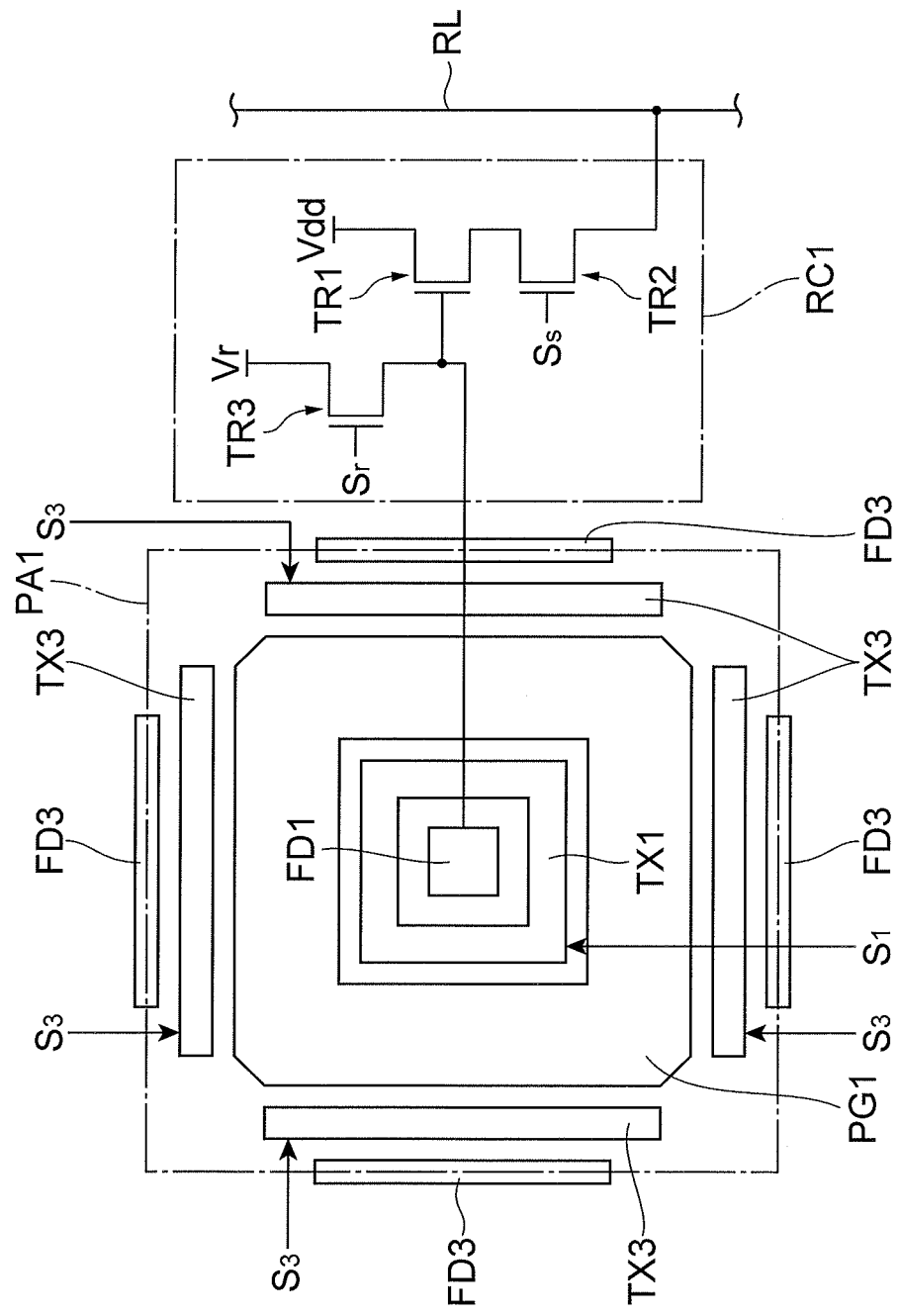
FIG. 11 is a schematic diagram for explaining a configuration of a pixel.

FIG. 11 is a schematic diagram for explaining a configuration of a pixel.

As a charge transfer signal, the detection gate signal $S_1$ is supplied to the first gate electrode TX1. A charge transfer signal $S_3$ is supplied to the third gate electrode TX3. When the high level detection gate signal $S_1$ is supplied to the first gate electrode TX1, charges generated in the charge generating region (mainly the region immediately below the photogate electrode PG1) flow as signal charges into the potential well constructed by the first semiconductor region FD1. The signal charges accumulated in the first semiconductor region FD1 are read out as a voltage output $V_{out1}$ corresponding to the accumulated charge quantity Q1 or a voltage output $V_{out2}$ corresponding to the accumulated charge quantity Q2 from the first semiconductor region FD1 by the readout circuit RC1. The voltage outputs $V_{out1}$, $V_{out2}$ correspond to the above-mentioned signal d'(m, n).

As illustrated in FIG. 11, the readout circuit RC1 comprises a source follower transistor TR1, select transistors TR1, TR2, and a reset transistor TR3. The first semiconductor region FD1 is connected to a gate electrode of the source follower transistor TR1. A source of the source follower transistor TR1 is connected to an electric power supply potential Vdd, while its drain is connected to the select transistor TR2. A drain of the select transistor TR2 is connected to a signal readout line RL. A voltage corresponding to the charge quantity Q1 or Q2 accumulated in the first semiconductor region FD1 is output to the signal readout line RL. A select signal $S_s$ is applied to a gate electrode of the select transistor TR2.

The first semiconductor region FD1 is also connected to a drain of the reset transistor TR3. When the reset transistor TR3 is turned on, the first semiconductor region FD1 is connected to a reset potential Vr, whereby the charges accumulated in the first semiconductor region FD1 are reset. A reset signal $S_r$ is applied to a gate electrode of the reset transistor TR3. The electric power supply potential Vdd and reset potential Vr differ from each other in their magnitudes depending on designs.

Figure 12:
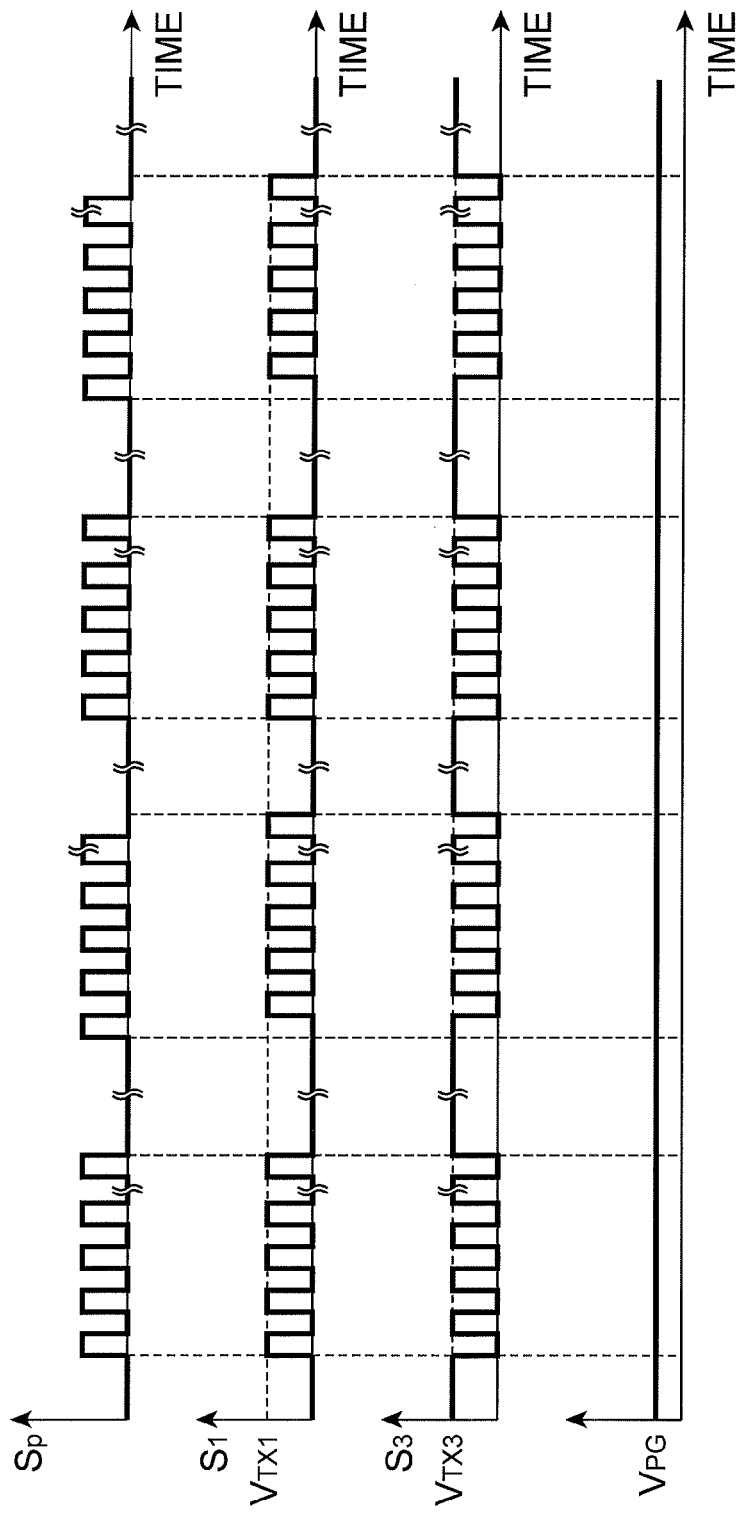
FIG. 12 is a timing chart of various signals.

FIG. 12 is a timing chart of actual various signals.

The period of one frame is constituted by a period for accumulating signal charges (accumulation period) and a period for reading out the signal charges (readout period). With focus on a single pixel, in the accumulation period, a signal based on the pulse drive signal $S_P$ is applied to the light source and, in synchronization therewith, the detection gate signal $S_1$ is applied to the first gate electrode TX1. Before the measurement of the distance, as mentioned above, the reset signal is applied to the reset transistor TR3, whereby the charges accumulated in the first semiconductor region FD1 are reset to the reset potential Vr. After the reset signal is turned on for an instant and then turned off, pulses of the detection gate signal $S_1$ are applied to the first gate electrode TX1, and furthermore charge transfer is sequentially performed in synchronization with the pulses. Thus, the signal charges are integrated and accumulated in the first semiconductor region FD1.

As illustrated in FIG. 12, the detection gate signal $S_1$ applied to the first gate electrode TX1 is intermittently given a phase shift at predetermined timing. In this embodiment, the first and second frames alternately continue. In the first frame, the detection gate signal $S_1$ has a phase difference of 0° with respect to the pulse drive signal $S_P$ in the accumulation period. In the second frame, the detection gate signal $S_1$ has a phase difference of 180° with respect to the pulse drive signal $S_P$ in the accumulation period. That is, a phase shift of 180° is given to the detection gate signal $S_1$ in every other frame. In each frame, the detection gate signal $S_1$ attains the high level a plurality of times in the accumulation period.

Thereafter, in the readout period, the signal charges accumulated in the first semiconductor region FD1 are read out. At this time, the charge transfer signal S3 applied to the third gate signal TX3 is at the high level, and therefore the positive electric potential is supplied to the third gate electrode TX3, whereby unnecessary charges flow into the potential well of the third semiconductor region FD3 and are discharge from the third semiconductor region FD3. When the detection gate signal $S_1$ applied to the first gate electrode TX1 is at the low level, the charge transfer signal $S_3$ supplied to the third gate electrode TX3 is set to the high level. That is, the detection gate signal $S_1$ and the charge transfer signal $S_3$ are in phases opposite from each other.

The electric potential $V_{PG}$ supplied to the photogate electrode PG1 is set lower than each of the electric potentials $V_{TX1}$, $V_{TX3}$. As a consequence, when the detection gate signal $S_1$ is at the high level, the potential $\phi_{TX1}$ is lower than the potential $\phi_{PG1}$. When the charge transfer signal $S_3$ is at the high level, the potential $\phi_{TX3}$ is lower than the potential $\phi_{PG1}$.

The electric potential $V_{PG}$ is set higher than the electric potential yielded when the detection gate signal $S_1$ and charge transfer signal $S_3$ are at the low level. When the detection gate signal $S_1$ is at the low level, the potential $\phi_{TX1}$ is higher than the potential $\phi_{PG1}$. Furthermore, when the charge transfer signal $S_3$ is at the low level, the potential $\phi_{TX3}$ is higher than the potential $\phi_{PG1}$.

Let $T_P$ be the pulse width of each of the above-mentioned pulse signals $S_P$, $S_1$, $S_D$. The above-mentioned charge quantity $Q_1$ or $Q_2$ is yielded in the range image sensor 1 when both of the detection gate signal $S_1$ and pulse detection signal $S_D$ are at the high level. Specifically, the charge quantity Q1 is yielded in the range image sensor 1 (charge generating region) when the detection gate signal $S_1$ is at the high level in synchronization with the pulse drive signal $S_P$ while the pulse detection signal $S_D$ is at the high level. The charge quantity Q2 is yielded in the range image sensor 1 (charge generating region) when the detection gate signal $S_1$ with a phase difference of 180° from the pulse drive signal Sp is at the high level while the pulse detection signal $S_D$ is at the high level.

The phase difference between the detection gate signal $S_1$ and pulse detection signal $S_D$ is in proportion to the charge quantity Q2. Letting Q1+Q2 be the total charge quantity occurring within one pixel, the pulse detection signal $S_D$ is later than the pulse drive signal $S_P$ by a period of $\Delta t = T_P \times Q2/(Q1+Q2)$. The time of flight $\Delta t$ of one pulse of light is given by $\Delta t = 2d/c$, where d is the distance to the object, and c is the velocity of light. Therefore, when two charge quantities (Q1, Q2) are output as the signal d'(m, n) having distance information from a specific pixel, the arithmetic circuit 5 calculates the distance to the object H, $d=(c \times \Delta t)/2 = c \times T_P \times Q2/(2 \times (Q1+Q2))$, according to the charge quantities (Q1, Q2) fed thereto and the pulse width $T_P$ known beforehand.

The arithmetic circuit 5 can calculate the distance d when the charge quantities Q1, Q2 are read out separately from each other as mentioned above. The above-mentioned pulses may be emitted repeatedly, and their integrated values may be output as the charge quantities Q1, Q2.

The ratio of the charge quantity Q1, Q2 to the total charge quantity corresponds to the above-mentioned phase difference, i.e., the distance to the object H. The arithmetic circuit 5 calculates the distance to the object H according to the phase difference. While the distance d is preferably given by $d=(c \times \Delta t)/2$, where $\Delta t$ is the time difference corresponding to the phase difference, appropriate calculations for correction may be performed additionally. For example, when the actual distance and the calculated distance d differ from each other, a factor β for correcting the latter may be determined beforehand, and the calculated distance d multiplied by the factor β may be taken as the finally calculated distance d in the product after shipment. Another available correction is such that an ambient temperature is measured, an operation to correct the speed of light c is performed if the speed of light c differs depending upon the ambient temperature, and then the distance calculation is performed. It is also possible to preliminarily store in a memory a relation between signals input into the arithmetic circuit and actual distances, and determine the distance by a lookup table method. The calculation method can be modified depending upon the sensor structure and the conventionally known calculation methods can be applied thereto.

In this embodiment, as in the foregoing, the fourth semiconductor region SR in which the readout circuit RC1 is arranged has the portion located at the corner portion of the pixel region PA1. That is, the pixel region PA1 and the fourth semiconductor region SR (the region where the readout circuit RC1 is arranged) are set so as to partly overlap each other. Therefore, the range image sensor 1 can restrain the aperture ratio and the sensor area utilization efficiency from decreasing, while appropriately arranging the readout circuit RC1.

When the charge generating region extends to the corner portion of the pixel region PA1, the charge generated in the region corresponding to the corner portion of the pixel region PA1 migrates by a long distance to the first semiconductor region FD1 arranged at the center portion of the pixel region PA1. In this case, it takes a longer time to transfer the charge generated in the region corresponding to the corner portion to the first semiconductor region FD1, thereby worsening the efficiency in transferring the signal charge to the first semiconductor region FD1. In this embodiment, by contrast, no charge generating region is arranged at the corner portions of the pixel region PA1 as mentioned above, so that no signal charge is transferred from regions where the migration length is longer. This improves the efficiency in transferring the signal charge to the first semiconductor region FD1.

The fourth semiconductor region SR enhances the potential in the region immediately below the fourth semiconductor region SR. Therefore, when transferring the signal charge to the first semiconductor region FD1, the potential gradient becomes greater, thereby raising the migration speed of the signal charge transferred from the charge generating region (the region immediately below the photogate electrode PG1) to the first semiconductor region FD1. This further improves the efficiency in transferring the signal charge to the first semiconductor region FD1.

These allow the range image sensor 1 in accordance with this embodiment to improve an accuracy of distance detection.

Meanwhile, in this embodiment, the first semiconductor region FD1 is located on the inside of the photogate electrode PG1 and has an area set smaller than that of the photogate electrode PG1. Therefore, the area of the first semiconductor region FD1 is much smaller than that of a region which can transfer charges to the first semiconductor region FD1 in the region immediately below the photogate electrode PG1 (charge generating region). The charges (charge quantities Q1, Q2) transferred to and accumulated in the first semiconductor region FD1 generate their respective voltage changes ($\Delta V$) represented by the following relational expressions according to the capacitance (Cfd) of the first semiconductor region FD1.

$$\Delta V = Q1/Cfd.$$

$$\Delta V = Q2/Cfd.$$

Therefore, as the area of the first semiconductor region FD1 decreases, the capacitance (Cfd) of the first semiconductor region FD1 becomes lower, thereby generating a greater voltage change ($\Delta V$). That is, a higher charge-to-voltage conversion gain is yielded. As a result, the range image sensor 1 can attain a higher sensitivity.

The semiconductor regions SR are arranged at all the corner portions of the pixel region PA1. This can further improve the efficiency in transferring signal charges to the first semiconductor region FD1.

The fourth semiconductor region SR having the portion located at the corner portion of one pixel region PA1 has the remaining portion located at corner portions of the pixel regions PA1 adjacent to the one given pixel region PA1. Therefore, even when the plurality of adjacent pixel regions PA1 are provided, the aperture ratio and sensor area utilization efficiency can be restrained from decreasing.

In this embodiment, the signal charges accumulated in the first semiconductor region FD1 at 0°-timings are read out as the voltage output $V_{out1}$ from the first semiconductor region FD1. The signal charges accumulated in the first semiconductor region FD1 at 180°-timings are read out as the voltage output $V_{out2}$ from the first semiconductor region FD1. One pixel region PA1 containing the photogate electrode PG1 (the charge generating region immediately below the photogate electrode PG1) corresponds to one pixel, and the distance is calculated according to the output from the same pixel. Therefore, the distance calculation can fluctuate less than in a configuration in which the distance is calculated according to outputs from a plurality of pixel regions. This can also raise the sensor area utilization efficiency and improve the spatial resolution.

The detection gate signal $S_1$ may be given a phase shift of 90° at a timing of 90°, a phase shift of 180° at a timing of 180°, or a phase shift of 270° at a timing of 270°. In this case, signal charges accumulated in the first semiconductor region FD1 at the timings of 0°, 90°, 180°, and 270° are read out as outputs from the first semiconductor region FD1, and the distance is calculated according to these outputs.

The third semiconductor region FD3 and third gate electrode TX3 are arranged on the outside of the charge generating region (region immediately below the photogate electrode PG1) along a side of the pixel region PA1. This can arrange an unnecessary charge discharging region, while restraining the aperture ratio from decreasing.

Since the first gate electrode TX1 surrounds the whole periphery of the first semiconductor region FD1, signal charges are collected into the first semiconductor region FD1 from all the directions of the first semiconductor region FD1. As a result, the area efficiency of the imaging region (aperture ratio) can be enhanced.

The third semiconductor region FD3 is located between the charge generating regions (regions immediately below the photogate electrodes PG1) adjacent in the row or column direction. That is, the charge generating regions adjacent in the row or column direction are electrically separated from each other by the third semiconductor region FD3. This can inhibit crosstalk from occurring between the pixel regions PA1. The fourth semiconductor region SR is located between the charge generating regions adjacent in a direction intersecting the row and column directions. Therefore, the charge generating regions adjacent in the direction intersecting the row and column directions are electrically separated from each other by the fourth semiconductor region SR. This can also inhibit crosstalk from occurring between the pixel regions PA1.

The configuration of the range image sensor 1 in accordance with a modified example of this embodiment will now be explained with reference to FIGS. 13 to 15.

Figure 13:
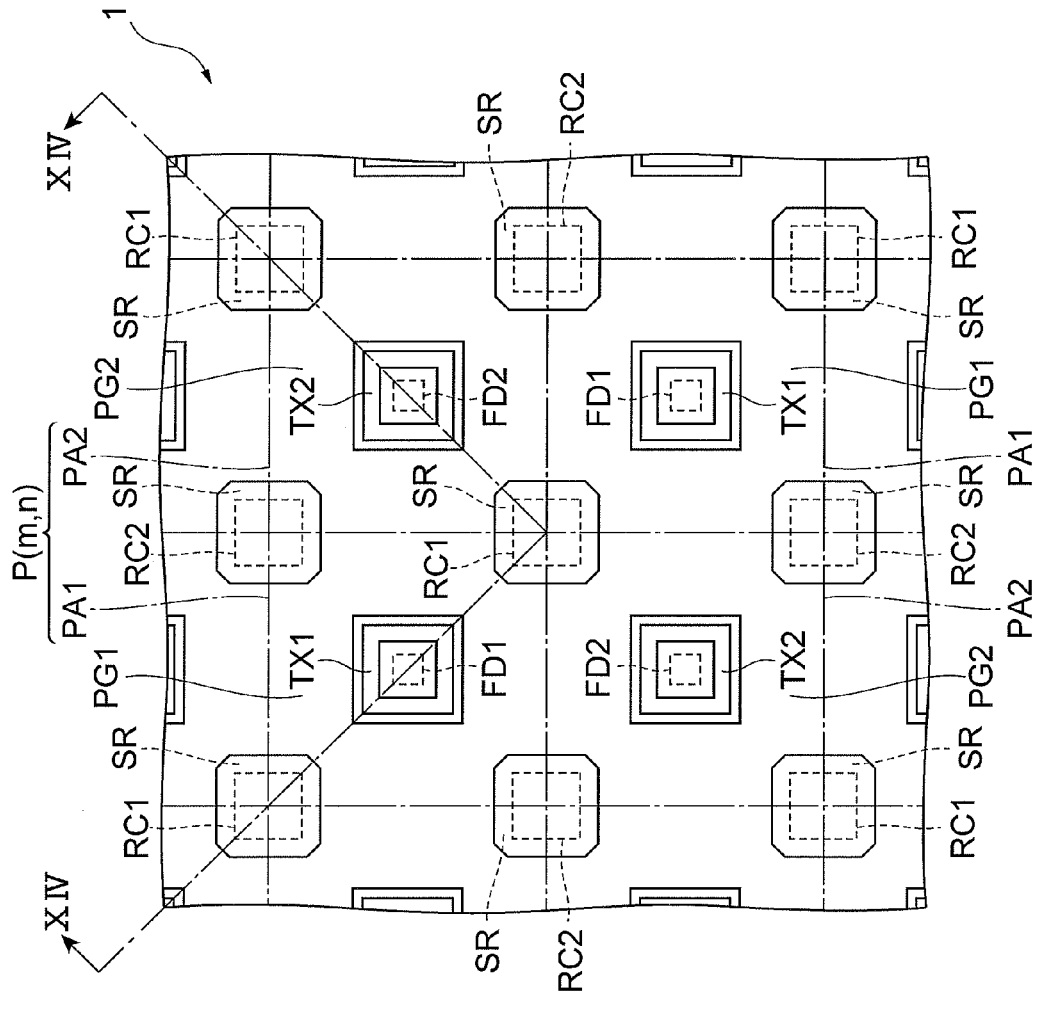
FIG. 13 is a schematic diagram for explaining a configuration of pixels in the range image sensor in accordance with a modified example.
Figure 14:
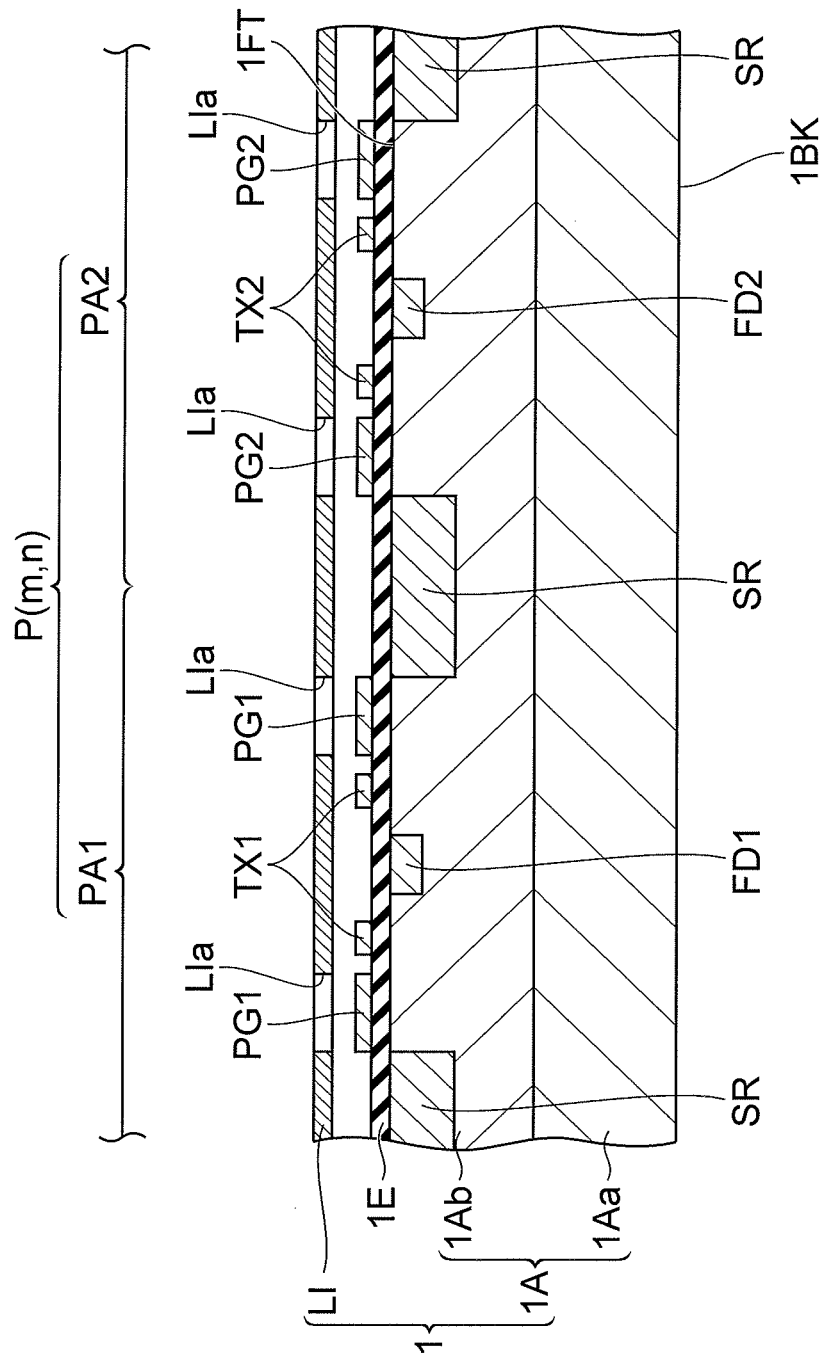
FIG. 14 is a diagram illustrating a cross-sectional configuration taken along the line XIV-XIV of FIG. 13.

The modified example illustrated in FIG. 13 differs from the above-mentioned embodiment in that each pixel P(m, n) of the range image sensor 1 includes two pixel regions PA1, PA2 adjacent in the row or column direction. FIG. 13 is a schematic diagram for explaining the configuration of pixels in the range image sensor in accordance with the modified example. FIG. 14 is a diagram illustrating a cross-sectional configuration taken along the line XIV-XIV of FIG. 13.

In the modified example, first unit disposed in the pixel region PA1 and second unit disposed in the pixel region PA2 are arranged adjacent in the row and column directions. A pair of the first and second units arranged adjacent in the row or column direction form one pixel P(m, n). Each of the pixel regions PA1, PA2 is substantially polygon-shaped when viewed in a plan view. In this embodiment, each of the pixel regions PA1, PA2 is rectangular-shaped (in detail, square-shaped). In the imaging region 1B, the pixel regions PA1, PA2 are arranged alternately in the row and column directions and are continuous in the row and column directions.

In each pixel region PA1, the range image sensor 1 in accordance with the modified example comprises a photogate electrode PG1, a first gate electrode TX1, a first semiconductor region FD1, and a plurality of fourth semiconductor regions SR. In each pixel region PA2, the range image sensor 1 comprises a photogate electrode PG2, a second gate electrode TX2, a second semiconductor region FD2, and a plurality of fourth semiconductor regions SR.

In the pixel region PA1, the photogate electrode PG1 is arranged so as to correspond to an opening LIa. In the pixel region PA2, the photogate electrode PG2 is arranged so as to correspond to an opening LIa. The photogate electrodes PG1, PG2 have outer edges extending to their corresponding sides of the pixel regions PA1, PA2 excluding the corner portions of the pixel regions PA1, PA2. By extending the outer edges to the sides of the pixel regions PA1, PA2, the photogate electrodes PG1, PG2 continue with each other in the row and column directions. In the pixel regions PA1, PA2, the outer contours of the photogate electrodes PG1, PG2 are approximately "+"-shape, and the inner contours thereof are approximately rectangle-shaped (in detail, square-shaped). The photogate electrodes PG1, PG2 are comprised of polysilicon but may use other materials as well.

The second semiconductor region FD2 is arranged on the inside of the photogate electrode PG2 so as to be surrounded by the photogate electrode PG2. The second semiconductor region FD2 is arranged as spatially separated from a region immediately below the photogate electrode PG2. That is, the second semiconductor region FD2 is arranged on the inside of the light receiving region so as to be surrounded by the light receiving region, and is arranged as spatially separated from the light receiving region.

The second semiconductor region FD2 is substantially polygon-shaped when viewed in a plan view. In this modified example, the second semiconductor region FD2 is rectangular-shaped (in detail, square-shaped). The second semiconductor region FD2 functions as a signal charge collecting region. The second semiconductor region FD2 is a region comprised of an n-type semiconductor having a high impurity concentration, and is floating diffusion region.

The second gate electrode TX2 is arranged between the photogate electrode PG2 (light receiving region) and the second semiconductor region FD2. The second gate electrode TX2 is located on the outside of the second semiconductor region FD2 so as to surround the second semiconductor region FD2, and is located on the inside of the photogate electrode PG2 so as to be surrounded by the photogate electrode PG2. The second gate electrode TX2 is arranged as spatially separated from the photogate electrode PG2 and the second semiconductor region FD2 so as to be interposed between the photogate electrode PG2 and the second semiconductor region FD2. The photogate electrode PG2 and second gate electrode TX2 are concentrically arranged about the second semiconductor region FD2 in the order of the second gate electrode TX2 and photogate electrode PG2 from the second semiconductor region FD2 side.

The second gate electrode TX2 is substantially polygonal loop-shaped when viewed in a plan view. In this embodiment, the second gate electrode TX2 is rectangular loop-shaped.

The second gate electrode TX2 is comprised of polysilicon but may use other materials as well. The second gate electrode TX2 functions as a transfer electrode.

Each fourth semiconductor region SR is arranged in the corner portion of the pixel region PA2 and outside the photogate electrode PG2. The fourth semiconductor regions SR adjacent in the row and column directions are formed integrally. That is, the fourth semiconductor region SR having a portion located at the corner portion of one pixel region PA1 has the remaining portion located at the respective corner portions of three pixel regions PA1, PA2 adjacent to the one pixel region PA1. The fourth semiconductor region SR having a portion located at the corner portion of one pixel region PA2 has the remaining portion located at the respective corner portions of three pixel regions PA1, PA2 adjacent to the one pixel region PA2. As a consequence, in four pixel regions PA1, PA2 adjacent in the row and column directions, the four fourth semiconductor regions SR located at the center portion of the pixel regions PA1, PA2 are single octagon-shaped.

Readout circuits RC1, RC2 are arranged in the fourth semiconductor regions SR. The readout circuit RC1 is provided for each pixel region PA1, while the readout circuit RC2 is provided for each pixel region PA2. The readout circuit RC1 reads out a signal corresponding to the charge quantity accumulated in the first semiconductor region FD1 of its corresponding pixel region PA1. The readout circuit RC2 reads out a signal corresponding to the charge quantity accumulated in the second semiconductor region FD2 of its corresponding pixel region PA2.

The second semiconductor region FD2 has thicknesses and impurity concentrations as follows:

thickness of 0.1~0.4 μm/impurity concentration of $1 \times 10^{18} \sim 10^{20}$ cm$^{-3}$.

The insulating layer 1E is also provided with contact holes (not depicted) for exposing the surfaces of the second semiconductor regions FD2. Conductors (not depicted) for connecting the second semiconductor regions FD2 to the outside are arranged within their corresponding contact holes.

The regions corresponding to the photogate electrodes PG1, PG2 in the semiconductor substrate 1A (regions immediately below the photogate electrodes PG1, PG2) function as charge generating regions for generating charges in response to light incident thereon. Hence, the charge generating regions correspond to the shapes of the photogate electrodes PG1, PG2 and openings LIa. That is, in each of the pixel regions PA1, PA2, the charge generating region has outer edges extending to their corresponding sides of the pixel regions PA1, PA2 excluding the corner portions of the pixel regions PA1, PA2. Specifically, in each of the pixel regions PA1, PA2, the outer contours of the charge generating region are approximately "+"-shape, and the inner contours thereof are approximately rectangle-shaped (in detail, square-shaped). By extending the outer edges to the sides of the pixel regions PA1, PA2, the charge generating regions continue with each other in the row and column directions.

Figure 15:
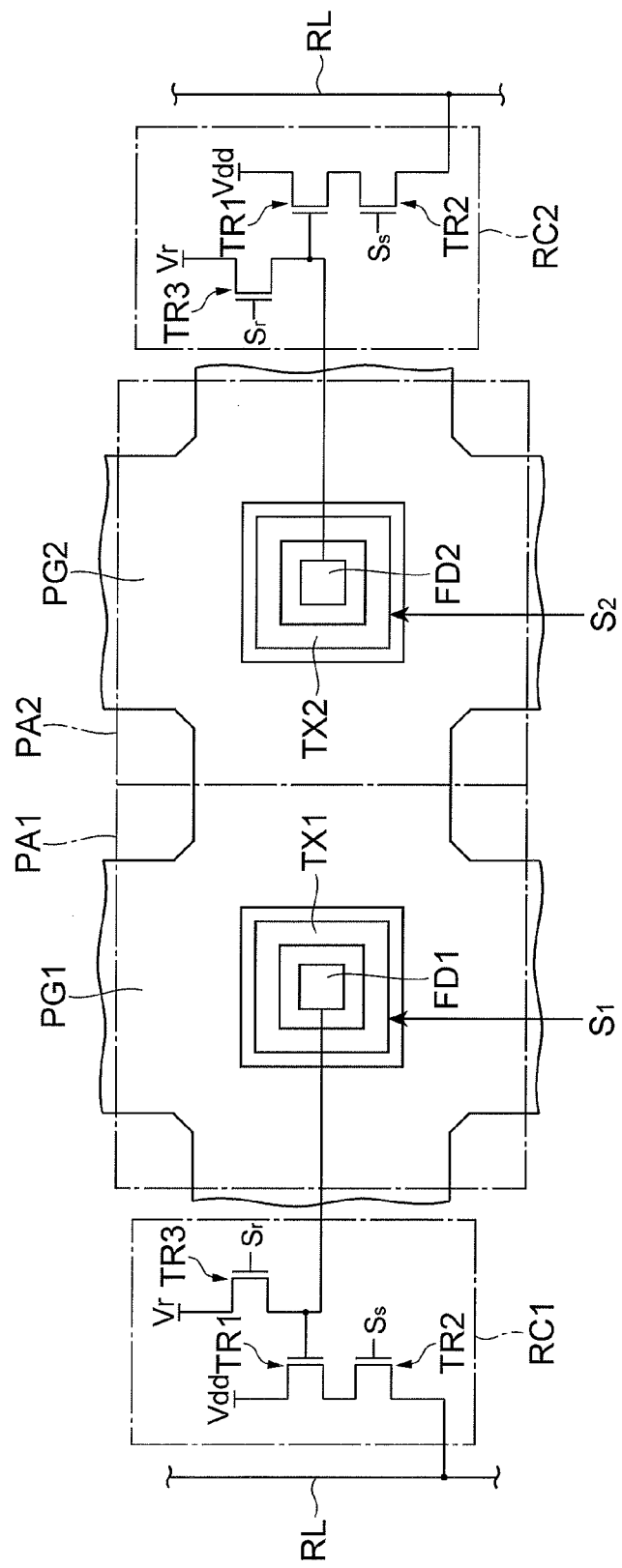
FIG. 15 is a schematic diagram for explaining a configuration of a pixel.
Figure 16:
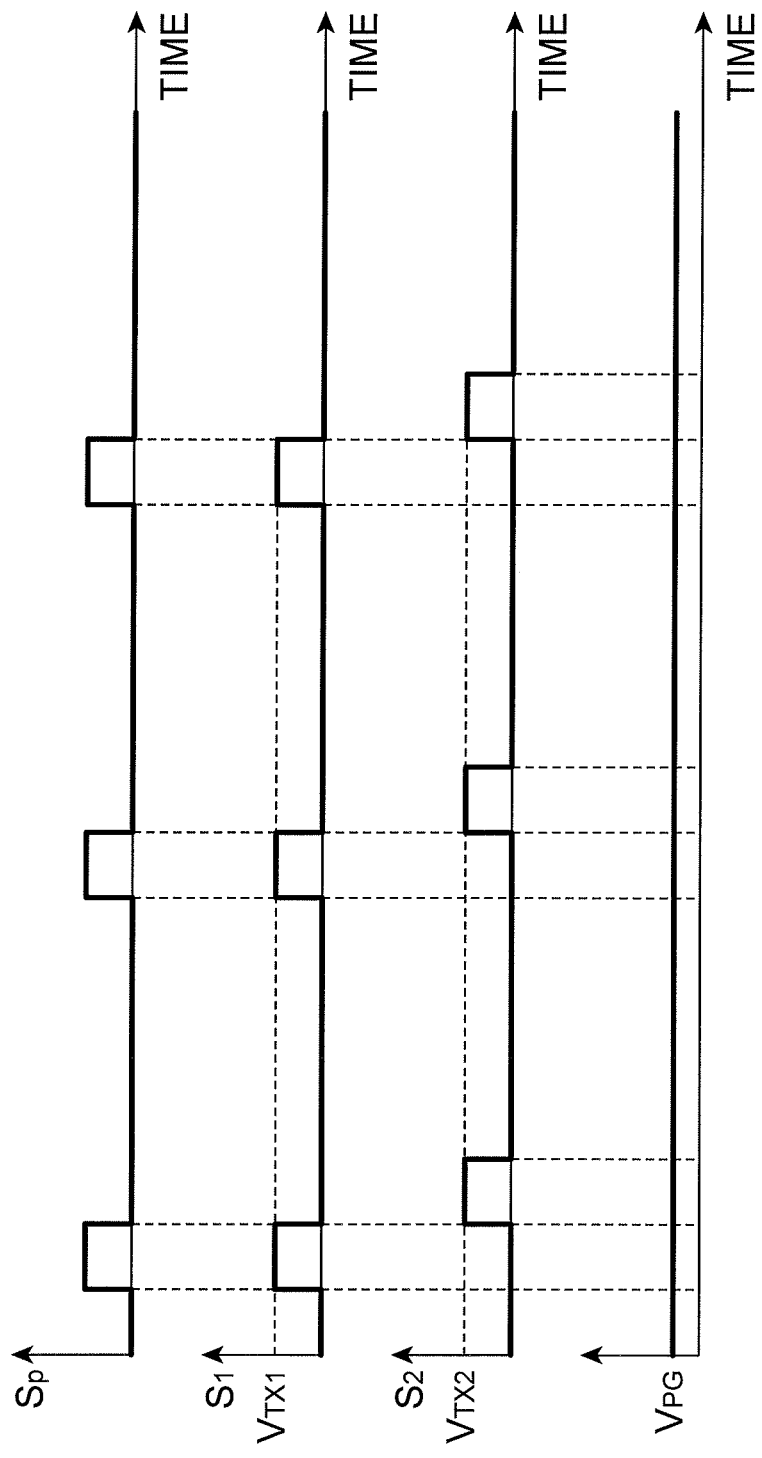
FIG. 16 is a timing chart of various signals.

FIG. 15 is a schematic view for explaining a configuration of a pixel. FIG. 16 is a timing chart of actual various signals.

With focus on a single pixel, in an accumulation period, a signal based on a pulse drive signal $S_P$ is applied to the light source, and the detection gate signal $S_1$ is applied to the first gate electrode TX 1, in synchronism therewith. Then, a detection gate signal S2 is applied to the second gate electrode TX2 at a predetermined phase difference (e.g., a phase difference of 180°) from the detection gate signal $S_1$. That is, charge transfer signals having phases different from each other are supplied to the first and second gate electrodes TX1, TX2, respectively. As illustrated in FIG. 15, the readout circuit RC2 comprises a source follower transistor TR1, a select transistor TR2, and a reset transistor TR3 as with the readout circuit RC1.

After the reset signal is turned on and then turned off, the pulses of the detection gate signals $S_1$, $S_2$ are sequentially applied to the first and second gate electrodes TX1, TX2, and furthermore charges are sequentially transferred in synchronization with the pulses. Then, the signal charges are integrated and accumulated in the first and second semiconductor regions FD1 and FD2. Subsequently, in a readout period, the signal charges accumulated in the first semiconductor regions FD1, FD2 are read out.

The first and second gate electrodes TX1, TX2 are supplied with the charge transfer signals having phases different from each other, respectively. When a high level signal (positive electric potential) is supplied to the second gate electrode TX2, a potential below the second gate electrode TX2 becomes lower than the potential in the regions immediately below the photogate electrodes PG1, PG2 in the semiconductor substrate 1A. As a consequence, negative charges (electrons) are drawn toward the second gate electrode TX2, so as to be accumulated in a potential well formed by the second semiconductor region FD2. The second gate electrode TX2 allows a signal charge to flow into the second semiconductor region FD2 in response to an input signal. When a low level signal (e.g., ground electric potential) is supplied to the second gate electrode TX2, a potential barrier is generated by the second gate electrode TX2. Therefore, the charges generated in the semiconductor substrate 1A are not drawn into the second semiconductor region FD2.

Charges generated in a charge generating region (chiefly in the region immediately below the photogate electrode PG1) flow as signal charges into the potential well constructed by the first semiconductor region FD1 while the high level detection gate signal $S_1$ is supplied to the first gate electrode TX1. The signal charges accumulated in the first semiconductor region FD1 are read out as a voltage output $V_{out1}$ corresponding to the accumulated charge quantity Q1 from the first semiconductor region FD1. Charges generated in a charge generating region (chiefly in the region immediately below the photogate electrode PG2) flow as signal charges into the potential well constructed by the second semiconductor region FD2 while the high level detection gate signal $S_2$ is supplied to the second gate electrode TX2. The signal charges accumulated in the second semiconductor region FD2 are read out as a voltage output $V_{out2}$ corresponding to the accumulated charge quantity Q2 from the second semiconductor region FD2.

The electric potential $V_{PG}$ supplied to the photogate electrodes PG1, PG2 is set lower than each of the electric potentials $V_{TX1}$, $V_{TX2}$. On the other hand, the electric potential $V_{PG}$ is set higher than the electric potential yielded when the detection gate signals $S_1$, $S_2$ are at the low level.

This modified example, as with the above-mentioned embodiment, can restrain the aperture ratio and the sensor area utilization efficiency from decreasing, while appropriately arranging the readout circuit.

Since no charge generating region is arranged at the corner portions of the pixel region PA2, no signal charge is transferred from regions where the migration length is longer. This improves the efficiency in transferring the signal charge to the second semiconductor region FD2. When the signal charge is transferred to the second semiconductor region FD2, the potential gradient becomes greater by the fourth semiconductor region SR, thereby raising the migration speed of the signal charge transferred to the second semiconductor region FD2. This further improves the efficiency in transferring the signal charge to the second semiconductor region FD2.

In this embodiment, the first and second semiconductor regions FD1, FD2 are located on the inside of the photogate electrodes PG1, PG2, respectively, and have respective area set smaller than that of the photogate electrodes PG1, PG2. This can enhance the charge-to-voltage conversion gain and attain a higher sensitivity in the range image sensor 1 as with the above-mentioned embodiment.

A plurality of pixel regions PA1, PA2 have their charge generating regions formed integrally with each other and the photogate electrodes PG1, PG2 formed integrally with each other. This can raise the sensor area utilization efficiency. A plurality of pixel regions PA1, PA2 have their fourth semiconductor regions SR formed integrally with each other. This can also raise the sensor area utilization efficiency.

The second gate electrode TX2 surrounds the whole periphery of the first semiconductor region FD2. Therefore, signal charges are collected into the second semiconductor region FD2 from all the directions of the second semiconductor region FD2. As a result, the area efficiency of the imaging region (aperture ratio) can be enhanced.

The above described the preferred embodiments of the present invention, but it should be noted that the present invention is not always limited to the above embodiments but can be modified in many ways without departing from the scope and spirit of the invention.

The shape of the pixel regions PA1 and PA2 is not limited to a rectangular shape (square shape). The shape of the pixel regions PA1, PA2 may be, for example, a triangular shape or a polygon with five or more vertices.

The range image sensor 1 is not limited to a front-illuminated type range image sensor. The range image sensor 1 may be a back-illuminated type range image sensor.

The charge generating region where charges are generated in response to incident light may be constituted by a photodiode (for example, an implanted photodiode or the like). The range image sensor 1 is not limited to a configuration in which pixels P(m, n) are disposed in a two-dimensional arrangement, but may have a configuration in which pixels P(m, n) are disposed in a one-dimensional arrangement.

The p- and n-type conductions in the range image sensor 1 in accordance with the above-mentioned embodiment are interchangeable.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A range sensor comprising:
 a charge generating region, arranged within a region of a polygonal pixel region excluding a corner portion thereof, for generating a charge in response to light incident thereon;
 a signal charge collecting region, arranged at a center portion of the pixel region on the inside of the charge generating region so as to be surrounded by the charge generating region, for collecting a signal charge from the charge generating region;
 a photogate electrode arranged on the charge generating region;
 a transfer electrode, arranged between the signal charge collecting region and the charge generating region, for allowing the signal charge from the charge generating region to flow into the signal charge collecting region in response to an input signal;

a semiconductor region having a portion located at the corner portion of the pixel region and the remaining portion located on the outside of the pixel region, and having a conductivity type opposite to that of the signal charge collecting region and an impurity concentration higher than that of surroundings thereof; and a readout circuit, arranged in the semiconductor region, for reading out a signal corresponding to a charge quantity accumulated in the signal charge collecting region, wherein the semiconductor regions are arranged at all the corner portions of the pixel region;

the range sensor comprising a plurality of adjacent said pixel regions;

wherein the remaining portion of the semiconductor region is located at a corner portion of the pixel region adjacent thereto.

2. A range sensor according to claim 1, further comprising:
an unnecessary charge discharging region, arranged on the outside of the charge generating region along a side of the pixel region, for discharging an unnecessary charge from the charge generating region; and
an unnecessary charge discharge gate electrode, arranged between the unnecessary charge discharging region and the charge generating region, for allowing the unnecessary charge from the charge generating region to flow into the unnecessary charge discharging region in response to an input signal.

3. A range sensor according to claim 1,
wherein a charge transfer signal intermittently given a phase shift at a predetermined timing is supplied to the transfer electrode.

4. A range sensor according to claim 1, comprising a plurality of adjacent said pixel regions;
wherein the respective charge generating regions of the plurality of pixel regions are formed integrally with each other; and
wherein the respective photogate electrodes of the plurality of pixel regions are formed integrally with each other.

5. A range sensor according to claim 4,
wherein the transfer electrodes of the plurality of pixel regions are supplied charge transfer signals having phases different from each other, respectively.

6. A range sensor according to claim 1,
wherein the signal charge collecting region is rectangular-shaped when viewed in a plan view; and
wherein the transfer electrode is substantially polygonal loop-shaped.

7. A range image sensor, having an imaging region comprising a plurality of units arranged one-dimensionally or two-dimensionally on a semiconductor substrate, for obtaining a range image according to charge quantities output from the units;
wherein each of the units is the range sensor according to claim 1.

8. A range sensor according to claim 1, further comprising:
a semiconductor substrate having a light incident surface and a back surface opposing each other, the semiconductor substrate having a first substrate region located on the back surface side and a second substrate region located on the light incident surface side, the first and second substrate regions having a conductivity type opposite to that of the signal charge collecting region, the second substrate region having an impurity concentration lower than that of the first substrate region,
wherein the charge generating region, the signal charge collecting region, and the semiconductor region are arranged in the second substrate, and the photogate electrode and the transfer electrode are provided on the second substrate.

9. A range sensor according to claim 1, wherein the photogate electrode is substantially polygonal loop-shaped.

10. A range sensor according to claim 1, wherein an outer contour of the photogate electrode is substantially "+"-shape, and an inner contour thereof is substantially rectangle-shaped, in the pixel region.

11. A range sensor according to claim 1, wherein the readout circuit is disposed for each of the pixel regions.

* * * * *